(12) United States Patent
Ouspenski et al.

(10) Patent No.: US 11,973,186 B2
(45) Date of Patent: *Apr. 30, 2024

(54) ION CONDUCTIVE MATERIAL INCLUDING HALIDE MATERIAL, ELECTROLYTE INCLUDING THE SAME, AND METHODS OF FORMING THE SAME

(71) Applicant: SAINT-GOBAIN CERAMICS & PLASTICS, INC., Worcester, MA (US)

(72) Inventors: Vladimir Ouspenski, Saint-Pierre-lès-Nemours (FR); Gaurav Assat, Paris (FR); John M. Frank, Akron, OH (US)

(73) Assignee: SAINT-GOBAIN CERAMICS & PLASTICS, INC., Worcester, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 18/296,132

(22) Filed: Apr. 5, 2023

(65) Prior Publication Data

US 2023/0261258 A1 Aug. 17, 2023

Related U.S. Application Data

(63) Continuation of application No. 17/734,616, filed on May 2, 2022, now Pat. No. 11,664,531, which is a
(Continued)

(51) Int. Cl.
*H01M 10/0562* (2010.01)
*C30B 23/08* (2006.01)
(Continued)

(52) U.S. Cl.
CPC ......... *H01M 10/0562* (2013.01); *C30B 23/08* (2013.01); *C30B 29/12* (2013.01); *H01M 10/0525* (2013.01); *H01M 2300/008* (2013.01)

(58) Field of Classification Search
CPC ..... H01M 10/0562; C30B 29/12; C30B 23/08
(Continued)

(56) References Cited

U.S. PATENT DOCUMENTS 5,985,486 A 11/1999 Giron
7,132,060 B2 11/2006 Zagumennyi et al.
(Continued)

FOREIGN PATENT DOCUMENTS

CN 108701860 A 10/2018
CN 109775744 A 5/2019
(Continued)

OTHER PUBLICATIONS

"Thickness." In New Oxford American Dictionary, edited by Stevenson, Angus, and Christine A. Lindberg. : Oxford University Press, 2010. https://www.oxfordreference.com/view/10.1093/acref/9780195392883.001.0001/m_en_us1298337. (Year: 2010).*
(Continued)

*Primary Examiner* — Sean P Cullen
(74) *Attorney, Agent, or Firm* — Abel Schillinger, LLP; Adrian Lawrence

(57) ABSTRACT

A solid ion conductive material can include a complex metal halide. The complex metal halide can include at least one alkali metal element. In an embodiment, the solid ion conductive material including the complex metal halide can be a single crystal. In another embodiment, the ion conductive material including the complex metal halide can be a crystalline material having a particular crystallographic orientation. A solid electrolyte can include the ion conductive material including the complex metal halide.

19 Claims, 5 Drawing Sheets

Related U.S. Application Data continuation of application No. 17/230,908, filed on Apr. 14, 2021.

(60) Provisional application No. 63/009,901, filed on Apr. 14, 2020.

(51) Int. Cl.
*C30B 29/12* (2006.01)
*H01M 10/0525* (2010.01)

(58) Field of Classification Search
USPC .......................................................... 429/322
See application file for complete search history.

(56) References Cited

U.S. PATENT DOCUMENTS

| | | | |
|---|---|---|---|
| 8,252,260 | B2 | 8/2012 | Itis |
| 8,304,115 | B1 | 11/2012 | Petkov et al. |
| 9,123,941 | B2 | 9/2015 | Visco et al. |
| 9,599,727 | B2 | 3/2017 | Ouspenski et al. |
| 10,818,967 | B2 | 10/2020 | Kaga et al. |
| 10,854,915 | B2 | 12/2020 | Ling et al. |
| 11,664,531 | B2 * | 5/2023 | Ouspenski .............. C30B 7/14 429/322 |
| 2005/0188914 | A1 | 9/2005 | Iltis et al. |
| 2009/0226816 | A1 | 9/2009 | Yoshida et al. |
| 2010/0098613 | A1 | 4/2010 | Iltis |
| 2011/0127967 | A1 | 6/2011 | Soloveichik et al. |
| 2013/0202971 | A1 | 8/2013 | Zhao et al. |
| 2014/0147753 | A1 | 5/2014 | Homma et al. |
| 2015/0111110 | A1 | 4/2015 | Wanatabe et al. |
| 2016/0103232 | A1 | 4/2016 | Ouspenski et al. |
| 2017/0155169 | A1 | 6/2017 | Hitz et al. |
| 2018/0219251 | A1 | 8/2018 | Rogren |
| 2018/0301754 | A1 | 10/2018 | Badding et al. |
| 2019/0020024 | A1 | 1/2019 | Wang et al. |
| 2019/0088995 | A1 | 3/2019 | Asano et al. |
| 2019/0379056 | A1 | 12/2019 | Chen |
| 2020/0044284 | A1 | 2/2020 | Fujino et al. |
| 2020/0075993 | A1 | 3/2020 | Ling et al. |
| 2020/0328453 | A1 | 10/2020 | Sakai et al. |
| 2020/0328454 | A1 | 10/2020 | Sakai et al. |
| 2020/0328456 | A1 | 10/2020 | Asano et al. |
| 2020/0328457 | A1 | 10/2020 | Sakai et al. |
| 2020/0328465 | A1 | 10/2020 | Sakaida et al. |
| 2020/0328466 | A1 * | 10/2020 | Nishio ................ C01G 35/006 |
| 2020/0350622 | A1 | 11/2020 | Sakaida et al. |
| 2021/0013543 | A1 | 1/2021 | Imai et al. |
| 2021/0269320 | A1 | 9/2021 | Kubo et al. |
| 2021/0269324 | A1 | 9/2021 | Kubo et al. |
| 2021/0320327 | A1 | 10/2021 | Ouspenski et al. |
| 2022/0045357 | A1 | 2/2022 | Ouspenski et al. |
| 2022/0216507 | A1 | 7/2022 | Sun et al. |
| 2022/0263126 | A1 | 8/2022 | Ouspenski et al. |

FOREIGN PATENT DOCUMENTS

| | | |
|---|---|---|
| CN | 110350238 A | 10/2019 |
| CN | 110994010 A | 4/2020 |
| CN | 111279431 A | 6/2020 |
| CN | 111279432 A | 6/2020 |
| CN | 111295720 A | 6/2020 |
| CN | 111453758 A | 7/2020 |
| CN | 112928326 A | 6/2021 |
| EP | 3419098 A1 | 12/2018 |
| EP | 3496202 A1 | 12/2019 |
| JP | H0474833 B2 | 11/1992 |
| JP | H10206902 A | 8/1998 |
| JP | 2006244734 A | 9/2006 |
| JP | 2009238739 A | 10/2009 |
| JP | 2017168393 A | 9/2017 |
| JP | 2018025582 A | 2/2018 |
| KR | 20070004670 A | 1/2007 |
| KR | 20180046574 A | 5/2018 |
| KR | 20200069215 A | 6/2020 |
| KR | 20200075250 A | 6/2020 |
| WO | 2009108184 A1 | 9/2009 |
| WO | 2013125485 A1 | 8/2013 |
| WO | 2015144074 A1 | 10/2015 |
| WO | 2016069749 A1 | 5/2016 |
| WO | 2017116599 A2 | 7/2017 |
| WO | 2017192163 A1 | 11/2017 |
| WO | 2018002303 A1 | 1/2018 |
| WO | 2018025582 A1 | 2/2018 |
| WO | 2018085847 A1 | 5/2018 |
| WO | 2018183771 A1 | 10/2018 |
| WO | 2019135315 A1 | 7/2019 |
| WO | 2019135316 A1 | 7/2019 |
| WO | 2019135317 A1 | 7/2019 |
| WO | 2019135318 A1 | 7/2019 |
| WO | 2019135319 A1 | 7/2019 |
| WO | 2019135320 A1 | 7/2019 |
| WO | 2019135321 A1 | 7/2019 |
| WO | 2019135322 A1 | 7/2019 |
| WO | 2019135323 A1 | 7/2019 |
| WO | 2019135328 A1 | 7/2019 |
| WO | 2019135336 A1 | 7/2019 |
| WO | 2019135341 A1 | 7/2019 |
| WO | 2019135342 A1 | 7/2019 |
| WO | 2019135343 A1 | 7/2019 |
| WO | 2019135344 A1 | 7/2019 |
| WO | 2019135345 A1 | 7/2019 |
| WO | 2019135346 A1 | 7/2019 |
| WO | 2019135347 A1 | 7/2019 |
| WO | 2019135348 A1 | 7/2019 |
| WO | 2019146216 A1 | 8/2019 |
| WO | 2019146217 A1 | 8/2019 |
| WO | 2019146218 A1 | 8/2019 |
| WO | 2019146219 A1 | 8/2019 |
| WO | 2019146236 A1 | 8/2019 |
| WO | 2019146292 A1 | 8/2019 |
| WO | 2019146293 A1 | 8/2019 |
| WO | 2019146294 A1 | 8/2019 |
| WO | 2019146295 A1 | 8/2019 |
| WO | 2019146296 A1 | 8/2019 |
| WO | 2019146308 A1 | 8/2019 |
| WO | 2019189821 A1 | 10/2019 |
| WO | 2016197006 A1 | 12/2019 |
| WO | 2020136952 A1 | 7/2020 |
| WO | 2020136954 A1 | 7/2020 |
| WO | 2020136956 A1 | 7/2020 |
| WO | 2020173781 A1 | 9/2020 |
| WO | 2020175171 A1 | 9/2020 |

OTHER PUBLICATIONS

"Ceramic." In New Oxford American Dictionary, edited by Stevenson, Angus, and Christine A. Lindberg. : Oxford University Press, 2010. https://www.oxfordreference.com/view/10.1093/acref/9780195392883.001.0001/m_en_us1231751. (Year: 2010).*

Supplementary European Search Report for EP21789040.9, dated Jun. 26, 2023, 13 pages.

Cordero-Borboa A E et al: "Structural and textural characterization of a novel spatially coherent crystalline nanocomposite obtained from a melt of KBr, RbCl, RbBr, KI, RbI, and KCl salts", Journal of Material Science Kluwer Academic Publishers Dordrecht, vol. 43, No. 13, Jul. 1, 2008, pp. 4573-4582, XP036668039, ISSN: 0022-2461, DOI: 10.1007/S10853-008-2686-Y (retrieved on Jul. 1, 2008) *p. 4577*.

Meyer, G. et al., "Simple and Complex Halides," Handbook on the Physics and Chemistry of Rare Earths, vol. 28, 2000, pp. 53-129.

Meyer, Gerd et al. "The Amomonium-Bromide Route to Anhydrous Rare Earth Bromides Mbr3" Journal of the Less-Common Metals, 127, 1987, pp. 155-160.

Muy, Sokseiha et al., "High-Throughput Screening of Solid-State Li-Ion Conductors Using Lattice-Dynamics Descriptors," iScience, vol. 16, 2019, pp. 270-282.

Ohno, S. et al. "Materials design of ionic conductors for solid state batteries," Progress in Energy, 2020, 20, 36 pages.

(56) References Cited

OTHER PUBLICATIONS

Park, K-H. et al., "High-Voltage Superionic Halide Solid Electrolytes for All-Solid-State Li-Ion Batteries," ACS Energy Letters, Jan. 30, 2020, 5, pp. 533-539.
Qie, Y. et al. "Yttrium-Sodium Halides as Promising Solid-State Electrolytes with High Ionic Conductivity and Stability for Na-Ion Batteries," The Journal of Physical Chemistry Letters, 2020, 11, pp. 3376-3383.
Saha, S. et al. "Exploring the Bottlenecks of Anionic Redox in Li-rich 1 Layered Sulfides," Nature Energy, 4 (11), 2019, pp. 1-25.
Saha, S. et al. "Polymorphism in Li 4 Zn(PO4) 2 and Stabilization of its Structural Disorder to Improve Ionic Conductivity," Chemistry of Materials, American Chemical Society, 2018, 30(4), pp. 1379-1390.
Schlem, R. et al., "Mechanochemical Synthesis: A Tool to Tune Cation Site Disorder and Ionic Transport Properties of Li3MCl6 (M = Y, Er) Superionic Conductors," Advanced Energy Materials, 2019, pp. 1-10.
Shao, C. et al., "Structure and ionic conductivity of cubic Li7La3Zr2O12 solid electrolyte prepared by chemical co-precipitation method," Solid State Ionics, 2016, V. 287, pp. 13-16.
Steiner, H-J. et al., "Neue schnelle Ionenleiter vom Typ MMIIICl6 (MI = Li, Na, Ag; MIII = In, Y)" Zeitschrift für anorganische und allgemeine Chemie 613 (1992), pp. 26-30.
Sun, Y. et al., "Thermodynamic optimization and calculation of the YCl3—ACl (A=Li, Na, K, Rb, Cs) phase diagrams." Calphad, vol. 39 (2012), pp. 1-10.
Tomita, Y. et al. "Substitution effect of ionic conductivity in lithium ion conductor, LI3INBR6-xCLx," Solid State onics, 179, 2008, pp. 867-870.
Wang, C. et al., "Stabilizing interface between Li10SnP2S12 and Li metal by molecular layer deposition," Nano Energy (2018), V.53, pp. 168-174.
Wang, S. et al., "Lithium Chlorides and Bromides as Promising Solid-State Chemistries for Fast Ion Conductors with Good Electrochemical Stability." Angewandte Chemie International Edition, 58.24 (2019), 8039-8043.
Xiao, Y. et al. "Computational Screening of Cathode Coatings for Solid-State Batteries," Joule, 3, 2019, pp. 1252-1275.
Xue, W. et al., "The effect of sintering process on lithium ionic conductivity of Li6.4Al0.2La3Zr2O12 garnet produced by solid-state synthesis," The Royal Society of Chemistry Adv, 2018, V.8, pp. 13083-13088.
Yeandel, S. et al. "Structure and Lithium Ion Dynamics in Fluoride Doped Cubic LLZO (Li7La3Zr2O12) Garnet for Li Solid State Battery Applications," The Journal of Physical Chemistry, 2018, 31 pages.
Yu, C. et al. "Facile Synthesis toward the Optimal Structure-Conductivity Characteristics of the Argyrodite Li6PS5Cl Solid-State Electrolyte," Applied Materials & Interfaces, 2018, 10, 33296-33306.
Yu, S. et al. "Thermodynamic Assessment of Coating Materials for Solid-State Li, Na, and K Batteries," ACS Applied Materials & Interfaces, 2019, pp. 1-10.
Zevgolis, A. et al. "Alloying Effects on Superionic Conductivity in Lithium Indium Halides for All-Solid-State Batteries," Applied Physics Letters Materials, 2017, 16 pages.
Zhang, S. et al. "Advanced High-Voltage All-Solid-State Li-Ion Batteries Enabled by a Dual-Halogen Solid Electrolyte," Advanced Energy Materials, 2021, 10 pages.
Zhang, T. et al. "Designing composite solid-state electrolytes for high performance lithium ion or lithium metal batteries," Chemical Science, Royal Society of Chemistry, Jul. 20, 2020, pp. 8686-8707.
Zhang, Z. et al., "New horizons for inorganic solid state ion conductors," Energy & Environmental Science, 2018, V.11, pp. 1945-1976.
Zhou, L. et al. "New Family of Argyrodite Thioantimonate Lithium Superionic Conductors," Journal of the American Chemical Society, 2019, 141, pp. 19002-19013.
Doty et al., Elpasolite Scintillators, 12/212, Sandia National Laboratories, 1-108 (Year: 2012).
Liu et al., "3D Lithium Metal Anodes Hosted in Asymmetric Garnet Frameworks toward High Energy Density Batteries," Energy Storage Materials, vol. 14, published Sep. 2018, 33 pages.
Mo, "Solid Electrolyte Chemistry with Fast Ion Conduction and Good Electrochemical Stability: Insights from First Principles Computation," Department of Materials Science and Engineering, Maryland Energy Innovation Institute, University of Maryland, College Park, MD, published 2019, 16 pages.
International Search Report and Written Opinion for PCT/US2021/027359, dated Aug. 3, 2021, 14 pages.
Baker, D. W. "A comprehensive study of the phase diagram of KxNa1-xNbO3," Applied Physics Letters, 2009, 95, pp. 091903-1-091903-3.
Banerjee, A. et al. "Revealing Nanoscale Solid-Solid Interfacial Phenomena for Long-Life and High-Energy All-Solid-State Batteries," ACS Applied Materials & Interfaces, 2019, pp. A-H.
Choi, S. et al., "Bio-inspired Self-Healing Electrolytes for Li—S Batteries," Chem 3, 2017, pp. 383-389.
Choudhury, S. et al., "Sollid State polymer electrolytes for high-performance lithium metal batteries," Nature Communications, 2019, V.10, pp. 1-8.
Famprikis, T. et al., "Fundamentals of inorganic solid-state electrolytes for batteries." Natute Materials, 2019, 14 pages.
Gautam, A. et al. "Rapid crystallization and kinetic freezing of site-disorder in the lithium superionic argyrodite Li6PS5Br," Institute of Physical Chemistry, Justus-Liebig-University Giessen, 2019, 31, 22 pages.
Gombotz, M. et al. "Lithium-Ion Transport in Nanocrystalline Spinel-Type Li[InxLiy]Br4 as Seen by Conductivity Spectroscopy and NMR," Frontiers in Chemistry, Feb. 25, 2020, vol. 8, article 100, pp. 1-10.
Hamadene, M. et al. "Phase transition, ferroelasticity and ferroelectricity in Li3InF6," Materials Letters, 27, 1996, pp. 33-39.
"Hayamizu, Kikuko et al. ""Relationship between Li+ diffusion and ion conduction for single-crystal and powder garnet-type electrolytes studied by 7Li PGSE NMRspectroscopy,"" Phys. Chem. Chem. Phys., 2019, 21, 23589-23597."
Hull, S. et al. "Superionics: crystal structures and conduction processes," Institute of Physics Publishing, Reports on Progress in Physics, 67, 2004, pp. 1233-1314.
Kataoka, Kunimitsu et al. "Lithium-ion conducting oxide single crystal as solid electrolyte for advanced lithium battery application," Scientific reports, 2018, pp. 1-9.
Kerman, Kian et al., "Review—Practical Challenges Hindering the Development of Solid State Li Ion Batteries," Journal of The Electrochemical Society, 164 (2017), pp. A1731-A1744.
Lau, J. et al., "Sulfide Solid Electrolytes for Lithium Battery Applications," Advanced Energy Materials, 2018, 8, pp. 1-24.
Li, X. et al., "Air-stable Li3InCl6 electrolyte with high voltage compatibility for all-solid-state batteries," Energy & Environmental Science 12(9), 2019, pp. 2665-2671.
Li, X. et al., "Water-Mediated Synthesis of a Superionic Halide Solid Electrolyte," Angew Chem Int Ed Engl., 2019, 58, pp. 16427-16432.
Li, X. et al. "Progress and perspectives on halide lithium conductors for all-solid-state lithium batteries," Energy & Environmental Science, vol. 13, Royal Society of Chemistry, Mar. 3, 2020, pp. 1429-1461.
Liang, J. et al. "Site-Occupation-Tuned Superionic LixScCl3+x Halide Solid Electrolytes for All-Solid-State Batteries," Journal of the American Chemical Society, Mar. 26, 2020, 27 pages.
Liu, Z. et al. "High Ionic Conductivity Achieved in Li3Y(Br3Cl3) Mixed Halide Solid Electrolyte via Promoted Diffusion Pathways and Enhanced Grain Boundary," ACS Energy Letters, 2021, 6, pp. 298-304.
Mauger, A. et al. "Building Better Batteries in the Solid State: A Review," Materials, 2019, 12, 3892, pp. 1-86.
McGuire, M. et al. "Crystal and Magnetic Structures in Layered, Transition Metal Dihalides and Trihalides," Materials Science and Technology Division, Oak Ridge National Laboratory, 2017, pp. 1-17.

(56) References Cited

OTHER PUBLICATIONS

Asano et al., "Solid Halide Electrolytes with High Lithium-Ion Conductivity for Application in 4 V Class Bulk-Type All-Solid-State Batteries," Advanced Materials, vol. 30, Issue 44, published Sep. 14, 2018.
Bohnsack et al., "Ternäre Halogenide vom Typ A3MX6. IV. [1]. Ternäre Halogenide des Scandiums mit Natrium, Na3ScX6 (X = F, Cl, Br): Synthese, Strukturen, Ionenleitfähigkeit," Zeitschrift fuer Anorganische und Allgemenie Chemie, vol. 622, Issue 1, published Jan. 1996, English abstract only.
Bohnsack et al., "Ternäre Halogenide vom Typ A3MX6. V. Synthese, Kristallstrukturen und Natrium-Ionenleitfähigkeit der ternären Iodide Na3MI6 (M = Sm, Gd—Dy) sowie der Mischkristalle Na3GdBr6-xIx," Zeitschrift fuer Anorganische und Allgemenie Chemie, vol. 623, Issue 1-6, published Nov. 9, 2004, English abstract only.
Bohnsack et al., "Ternäre Halogenide vom Typ A3MX6. VI [1]. Ternäre Chloride der Selten-Erd-Elemente mit Lithium, Li3MCl6 (M = Tb—Lu, Y, Sc): Synthese, Kristallstrukturen und Ionenbewegung," Zeitschrift fuer Anorganische und Allgemenie Chemie, vol. 623, Issue 7, published Nov. 9, 2004, English abstract only.
Bohnsack et al., "Ternäre Halogenide vom Typ A3MX6. VII [1]. Die Bromide Li3MBr6 (M = Sm—Lu, Y): Synthese, Kristallstruktur, Ionenbeweglichkeit," Zeitschrift fuer Anorganische und Allgemenie Chemie, vol. 623, Issue 9, published Nov. 9, 2004, English abstract only.
Choi et al., "LiI-Doped Sulfide Solid Electrolyte: Enabling a High-Capacity Slurry-Cast Electrode by Low-Temperature Post-Sintering for Practical All-Solid-State Lithium Batteries," ACS Appl. Mater. Interfaces, published 2018, vol. 10, Issue 37, abstract only.
Collins et al., "Lithium Chloride and Ammonia Complexes," Journal of Physical Chemistry, published 1928, vol. 32, Issue 11, 12 pages.
Feinauer et al., "Unlocking the Potential of Fluoride-Based Solid Electrolytes for Solid-State Lithium Batteries," ACS Appl. Energy Mater., published 2019, vol. 2, Issue 10, abstract only.
Kahle et al., "High-throughput computational screening for solid-state Li-ion conductors," Energy & Environmental Science, Issue 3, published Jan. 10, 2020, abstract only.
Lee et al., "Selection of binder and solvent for solution-processed all-solid-state battery," Journal of the Electrochemical Society, vol. 164, Issue 9, published 2017, abstract only.
Ha, S. et al. "Sodium-Metal Halide and Sodium-Air Batteries," ChemPhysChem, Jun. 20, 2014, abstract only.
Mattfeld et al., "Ternäre Halogenide vom Typ A3MX6. 1 A3YCl6 (A = K, NH4, Rb, Cs): Synthese, Strukturen, Thermisches Verhalten. Über einige analoge Chloride der Lanthanide," Zeitschrift fuer Anorganische und Allgemenie Chemie, vol. 618, Issue 12, published Dec. 1992, English abstract only.
Meyer et al., "An Analysis of the Ammonium Chloride Route to Anhydrous Rare-Earth Metal Chlorides," Materials Research Bulletin, vol. 17, Issue 11, published Nov. 1982, abstract only.
Nagel et al., "6Li and 7Li MAS NMR Studies on Fast Ionic Conducting Spinel-Type Li2MgCl4, Li2-xCuxMgCl4, Li2-xNaxMgCl4, and Li2ZnCl4," Journal of Solid State Chemistry, vol. 165, Issue 2, published May 2002, abstract only.
Owens et al., "High-conductivity solid electrolytes: MAg4I5." Science, vol. 157, Issue 3786, published Jul. 21, 1967, abstract only.
Quinzeni et al., "Stability of low-temperature Li7La3Zr2O12 cubic phase: The role of temperature and atmosphere," Materials Chemistry and Physics, vol. 185, published Oct. 2016, abstract only.
Samson et al., "A bird's-eye view of Li-stuffed garnet-type Li7La3Zr2O12 ceramic electrolytes for advanced all-solid-state Li batteries," Energy & Environmental Science, Issue 10, published 2019, abstract only.
Schlem, R. et al. "Lattice Dynamical Approach for Finding the Lithium Superionic Conductor Li3ErI6," ACS Applied Energy Materials, published Mar. 9, 2020, vol. 3, Issue 4, abstract only.
Seifert, "Ternary chlorides of the trivalent late lanthanides Phase diagrams, crystal structures and thermodynamic properties," Journal of Thermal Analysis and Calorimetry, vol. 83, Issue 2, published Feb. 9, 2006, abstract only.
Sendek et al., "Machine Learning-Assisted Discovery of Solid Li-Ion Conducting Materials," Chemistry of Materials, published Nov. 21, 2018, 342-352.
Stenzel et al., "Ternäre Halogenide vom Typ A3MX6. II. Das System Ag3-xNaxYCl6: Synthese, Strukturen, Ionenleitfähigkeit," Zeitschrift fuer Anorganische und Allgemenie Chemie, vol. 619, Issue 4, published Apr. 1993, English abstract only.
Wickleder et al., "Ternäre Halogenide vom Typ A3MX6. III. Synthese, Strukturen, Ionenleitfähigkeit der Halogenide Na3MX6 (X = Cl, Br)," Zeitschrift fuer Anorganische und Allgemenie Chemie, vol. 621, Issue 3, published Mar. 1995, English abstract only.
Wu et al., "Garnet-Type Fast Li-Ion Conductors with High Ionic Conductivities for All-Solid-State Batteries," ACS Appl. Mater. Interfaces, published Mar. 23, 2017, vol. 9, Issue 14, abstract only.
Yu et al., "High-energy 'composite' layered manganese-rich cathode materials via controlling Li2MnO3 phase activation for lithium-ion batteries," Physical chemistry chemical physics, published Apr. 11, 2012, abstract only.
Zhao et al., "Superionic Conductivity in Lithium-Rich Anti-Perovskites," Journal of the American Chemical Society, vol. 134, Issue 36, published Jul. 30, 2012, abstract only.
Boulineau et al., "Structure of Li2MnO3 with different degrees of defects," Solid State Ionics, vol. 180, Issue 40, published Jan. 2010, abstract only.
Lee, Y-G. et at., "High-energy long-cycling all-solid-state lithium metal batteries enabled by silver-carbon composite anodes," Nature Energy, 2020, vol. 5, pp. 299-308, abstract only.
Yang Dongmei et al.: "Synthesis of Li1-xNaxYF4:Yb3+/Ln3+ (0 ≤ x ≤ 0.3, Ln= Er, Tm, Ho) nanocrystals with multicolor up-conversion luminescence properties for in vitro cell imaging", Journal of Materials Chemistry, vol. 22, No. 38, Jan. 2012, p. 20618, XP093084289, GB. ISSN: 0959-9428, DOI: 10.1039/c2hm33910b.
Banski M et al.: "Crystal phase transition in LixNa1-xGdF4 solid solution anocrystals - tuning of optical properties", Journal of Materials Chemistry C, vol. 2, No. 46, Sep. 29, 2014, pp 9911-9917, XP093084284, GB. Issn: 2050-7526, Doi: 10.1039/C4TC01539H.

* cited by examiner

ION CONDUCTIVE MATERIAL INCLUDING HALIDE MATERIAL, ELECTROLYTE INCLUDING THE SAME, AND METHODS OF FORMING THE SAME

CROSS-REFERENCE TO RELATED APPLICATIONS

This application is a continuation of and claims priority under 35 U.S.C. § 120 to U.S. patent application Ser. No. 17/734,616, issued as U.S. Pat. No. 11,664,531 B2, entitled "ION CONDUCTIVE MATERIAL INCLUDING COMPLEX METAL HALIDE, ELECTROLYTE INCLUDING THE SAME, AND METHODS OF FORMING THE SAME", by Vladimir Ouspenski et al., filed May 2, 2022, which is a continuation of and claims priority under 35 U.S.C. § 120 to U.S. patent application Ser. No. 17/230,908, entitled "ION CONDUCTIVE MATERIAL, ELECTROLYTE INCLUDING ION CONDUCTIVE MATERIAL, AND METHODS OF FORMING", by Vladimir Ouspenski et al., filed Apr. 14, 2021, which claims priority under 35 U.S.C. § 119(e) to U.S. provisional patent application No. 63/009,901, entitled "ION CONDUCTIVE MATERIAL, ELECTROLYTE INCLUDING ION CONDUCTIVE MATERIAL, AND METHODS OF FORMING", by Vladimir Ouspenski et al., filed Apr. 14, 2020, all of which are assigned to the current assignee hereof and incorporated herein by reference in their entireties for all purposes.

FIELD OF THE DISCLOSURE

The following is directed to a solid ion conductive material, electrolyte including the ion conductive material, and methods of forming the same, and to, in particular, a solid ion conductive material including a complex metal halide, electrolyte including the same, and methods of forming the same.

DESCRIPTION OF THE RELATED ART

Solid-state lithium batteries, by enabling lithium metal anode, are expected to provide higher energy densities and faster recharging times and cause less safety concerns compared to conventional lithium-ion batteries. Current solid electrolyte materials include oxides, halides, sulfides, fluorides, and solid polymer electrolytes.

Oxide-based materials have been considered safe and possessing good chemical and electrochemical stability. The synthesis of these compounds generally uses high temperatures that are above 1000-1200° C. The oxide-based materials are typically dense, rigid, and brittle with ionic conductivity up to 1.0 mS/cm at room temperature ($IC_{RT}$).

Halide compounds, such as chlorides and bromides, are generally safe and have good chemical and electrochemical stability, deformability, and plasticity, allowing relatively high compatibility with active electrode materials. Some $Li_3YCl_6$ (LYC) and $Li_3YBr_6$ (LYB) electrolytes have demonstrated room-temperature ionic conductivity $IC_{RT}$ above 1 mS/Cm. Halides are generally hygroscopic and form hydrates or undergo hydrolysis upon exposure to moisture. Halide solid electrolytes, such as LYC and LYB, are synthesized by using high-energy ball milling-based solid-state synthesis methods. The synthesis possesses challenges for mass production applications, further because expensive binary halide reactants and/or high-temperature annealing are used.

Fluorides are very similar to oxides in physical, chemical, and electrochemical properties, but in general, have $IC_{RT}$ values below 1 mS/cm.

Sulfides have relatively high ionic conductivity. For instance, $IC_{RT}$ can be as high as 25 mS/cm while commercially relevant sulfide or thiophosphate solid electrolytes can achieve 2-10 mS/cm. Sulfide materials are mechanically softer and deformable. However, sulfide materials tend to have poor electrochemical stability and cause safety concerns due to the risk of releasing toxic $H_2S$ gas when accidentally reacting together with water and heat. Further, high surface area sulfide solid electrolyte powders pose a particularly high $H_2S$ risk due to their increased reactivity even with ambient humidity.

Solid polymer electrolytes containing lithium salts in general have relatively low $IC_{RT}$ values and electrochemical stability.

The industry continues to demand improved solid electrolyte materials.

BRIEF DESCRIPTION OF THE DRAWINGS

The present disclosure may be better understood, and its numerous features and advantages made apparent to those skilled in the art by referencing the accompanying drawings.

Figure 1:
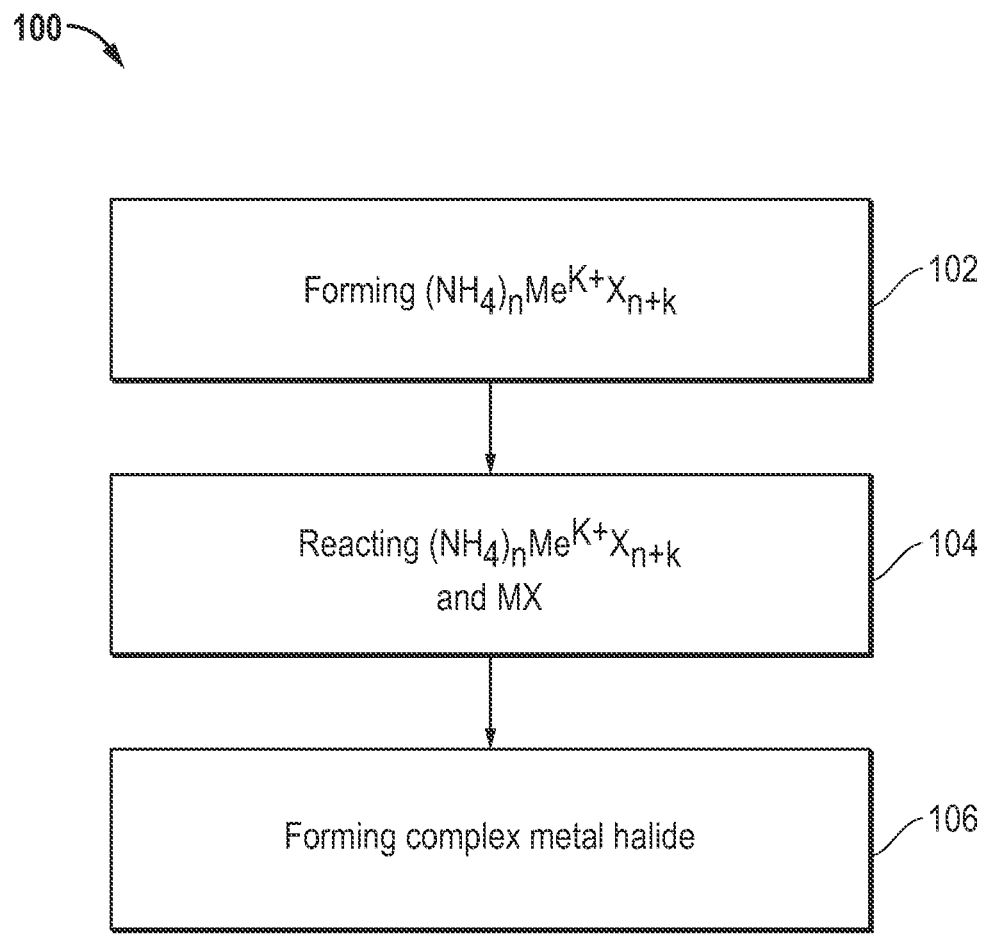
FIG. 1 includes a flowchart illustrating a process of forming a solid ion conductive material according to an embodiment.

Skilled artisans appreciate that elements in the figures are illustrated for simplicity and clarity and have not necessarily been drawn to scale. For example, the dimensions of some of the elements in the figures can be exaggerated relative to other elements to help improve understanding of embodiments of the invention. The use of the same reference symbols in different drawings indicates similar or identical items.

DETAILED DESCRIPTION

The following description in combination with the figures is provided to assist in understanding the teachings disclosed herein. The following discussion will focus on specific implementations and embodiments of the teachings. This focus is provided to assist in describing the teachings and should not be interpreted as a limitation on the scope or applicability of the teachings.

As used herein, the terms "comprises," "comprising," "includes", "including", "has", "having," or any other variation thereof, are intended to cover a non-exclusive inclusion. For example, a process, method, article, or apparatus that comprises a list of features is not necessarily limited only to those features but can include other features not expressly listed or inherent to such process, method, article, or apparatus. Further, unless expressly stated to the contrary, "or"

refers to an inclusive-or and not to an exclusive-or. For example, a condition A or B is satisfied by any one of the following: A is true (or present), and B is false (or not present), A is false (or not present) and B is true (or present), and both A and B are true (or present).

The use of "a" or "an" is employed to describe elements and components described herein. This is done merely for convenience and to give a general sense of the scope of the invention. This description should be read to include one or at least one and the singular also includes the plural, or vice versa, unless it is clear that it is meant otherwise.

Unless otherwise defined, all technical and scientific terms used herein have the same meaning as commonly understood by one of ordinary skill in the art to which this invention belongs. The materials, methods, and examples are illustrative only and not intended to be limiting.

Embodiments herein relate to a solid ion conductive material including a complex metal halide, wherein the metal can include at least one alkali metal element. In an embodiment, the solid ion conductive material can include a dopant including ammonium. In another embodiment, the solid ion conductive material can include a crystalline material, and in particular embodiments, oriented crystalline material, such as a single crystal having a particular crystallographic orientation or an oriented ceramic. The solid ion conductive material can have improved properties, such as purity, bulk ion conductivity, electrochemical stability, or any combination thereof, compared to conventional metal halide materials. In embodiments, the solid ion conductive material can be used to form an electrolyte, an anode, and/or a cathode, or another component of an electrochemical device. In particular embodiments, the solid ion conductive material can be a suitable component of a solid-state lithium battery.

Embodiments relate to methods of forming the ion conductive material. The method can allow the formation of the ion conductive material having improved properties, such as purity, ion conductivity, electrochemical stability, or a combination thereof. The method can also allow the improved formation of the ion conductive material. The method can be suitable for the massive production of the ion conductive material in a cost-efficient manner.

Referring to FIG. 1, a process for forming a solid ion conductive material 100 is illustrated.

The process 100 is different from the conventional solid-state synthesis for forming complex metal halide. The conventional process utilizes high-energy ball milling or directly heating the reactants mixture (e.g., simple metal halides) at a temperature near or below the melting points of the metal halides to perform the solid-state reaction. Because the probability of reacting individually separated particles in a mixture decreases as the reaction proceeds, achieving 100.00% completion of the reaction will theoretically take an infinite amount of time. It is thus understandable the reaction products resulted from the conventional solid-state synthesis that is based on high energy ball milling have a higher concentration of impurities, such as a simple metal halide (e.g., lithium halide and/or yttrium halide), due to incomplete reactions of the simple metal halides.

It is further notable the conventional synthesis of a complex halide based on the ammonium-halide route may not be applicable for forming the complex metal halide. Metal halides are used conventionally as starting materials. As some trivalent metal halides and tetravalent metal halides, and in particular rare-earth halides, tend to form stable metal halide hydrates, rendering it difficult to completely remove the water molecules from those hydrates. Increasing the temperature can result in the formation of undesired metal oxyhalide or metal oxyhydrate halide compounds at a higher concentration. Further, metal halide hydrates and metal oxyhalides, particularly those including rare earth metal, are rather stable compounds and less likely to form complex compound phases containing a high concentration of Li, such as $Li_3RE(OX)Cl_3$, wherein X is a halogen other than Cl. Further, those complex compounds would not be stable and would likely decompose into simple compounds.

The processes described in embodiments in this disclosure overcome the problems noted above.

The process 100 may start at block 102. A reaction mixture may be formed including starting materials. In an embodiment, the starting materials can include ammonium halide, $NH_4X$, wherein X includes Cl, Br, I, F, or any combination thereof. The starting material can further include one or more metal compounds, wherein the metal can include an alkali element, an alkaline earth element, a transition metal element, a lanthanide, a rare earth element, or any combination thereof.

In particular embodiments, the metal compound may be non-hygroscopic. In an aspect, the metal compound can include metal in the form of an oxide, carbonate, sulfate, hydrate, hydroxide, oxalate, acetate, nitrate, or any combination thereof. In particular aspects, the starting material can include more than one metal oxide. For example, the starting materials can include $Me_2O_k$, wherein Me can be a divalent metal, a trivalent metal, a tetravalent metal, a pentavalent metal, or a hexavalent metal; k is the valence of the metal; and $2 \leq k \leq 6$. In particular examples, Me can include a rare earth element including Ce, Dy, Er, Eu, Gd, Ho, La, Lu, Nd, Pr, Pm, Sm, Sc, Tb, Tm, Yb, Sc, and Y, In, Zn, alkaline metal element, Hf, Zr, or any combination thereof. In more particular examples, the starting material can include one or more of rare earth oxide or hydroxide or carbonate, $ZrO_2$ or $Zr(OH)_4$ or $Zr(CO_3)_2$ or $Zr(OH)_2CO_3 \cdot ZrO_2$ or any combination thereof.

In another aspect, the starting material can include an alkali metal compound, such as lithium carbonate, sodium carbonate, cesium carbonate, or a combination thereof. The starting material may further include an acid to facilitate the acidic synthesis in an aqueous, alcohol, or other polar molecular liquid solution.

In another particular instance, the metal compound may consist of alkali metal compounds. For example, the starting material can include alkali metal halides (e.g., NaCl, CsCl, and LiCl) and be free of a compound including Me.

In implementations, the starting materials may be mixed at a stoichiometric ratio. In other implementations, the ratio among the starting materials can allow the formation of a non-stoichiometric complex metal halide.

In an exemplary implementation, a reaction mixture may be formed including $NH_4X$, one or more rare earth metal oxide (referred to as "$RE_2O_3$" hereinafter), lithium carbonate, and hydrochloric or hydrobromic acid. A reaction is illustrated below noting the starting materials and reaction products in the aqueous solution.

$$3*Li_2CO_3 + RE_2O_3 + 12*HX + 6*NH_4X \rightarrow 2*(NH_4)_3REX_6 + 6*LiX + 6*H_2O + 3*CO_2$$

The above reaction is an example intended to aid understanding of the process 100. In view of the application, a skilled artisan appreciates another alkali metal compound, such as $Na_2CO_3$ or NaCl, may be used as a starting material. Similarly, an oxide of a non-rare earth element, such as $Fe_2O_3$, may be added to the reaction. A skilled artisan further appreciates the reaction products may change accordingly as the starting materials change.

In particular embodiments, the process 100 can include chemically substituting moisture (i.e., water) in a hydrated salt containing $MeX_k$ with $NH_4X$. In an aspect, the process can include forming $(NH_4)_n Me^{k+} X_{n+k}$, wherein $n>0$; and $2 \leq k < 6$. In a particular instance, $0 < n \leq 3$. In particular instances, n can be 0.33, 0.5, 1, 1.5, 2, 3, or 4, depending on what Me is. In the above-illustrated reaction, hydrated rare earth halide may be formed as an intermediate product and the water in the hydrates may be replaced by $NH_4X$ to form $(NH_4)_3 REX_6$ with an advantage non-forming hydrates compound, permitting to operate and keep hydroxide-free halide phases. As further illustrated, alkali metal halide, such as LiX, is also formed.

In an instance, the mixture of the reaction products may be filtered to remove larger particles to facilitate the subsequent reaction in the solid state. Larger particles can include impurities that come with any of the starting materials, remaining particles of the starting materials, carbon, or any combination thereof.

The process 100 can continue to block 104. In an embodiment, the mixture of the reaction products can be dried to facilitate a solid-state reaction of $(NH_4)_n Me^{k+} X_{n+k}$ and alkali metal halide, MX, wherein M is an alkali metal element. Drying may be performed in air or dry air and/or under vacuum or reduced pressure, such as 100 mbar, 40 mbar, 1 mbar, or even 0.01 mbar. In some instances, $N_2$ or Ar flow may be used to facilitate removal of water. In another example, heat may be applied to aid evaporation of water. The heating temperature can be from 100° C. to 160° C. Drying may be conducted until a trace amount of water is left in the mixture, such as from 1 wt % to 3 wt %.

In an embodiment, the process 100 can include performing a solid-state reaction of $(NH_4)_n Me^{k+} X_{n+k}$ and MX. In a particular example, from the above-illustrated reaction products, the solid-state reaction of $(NH_4)_3 REX_6$ and LiX may be performed. In another embodiment, the process 100 can include forming $(NH_4)_n M_{3-z} Me^{k+} X_{3+n+k-z}$, wherein $-3 \leq z = \leq 3$. When $z=0$, $(NH_4)_n M_{3-z} Me^{k+} X_{3+n+k-z}$ is stoichiometric. When z is not zero, $(NH_4)_n M_{3-z} Me^{k+} X_{3+n+k-z}$ is non-stoichiometric. In particular instances, $0 \leq z < 1$. In a further instance, the process 100 can include forming $M_{3-z}(Me^{k+})_f X_{3-z+k*f}$, wherein $-3 \leq z < 3$; $2 \leq k < 6$; $0 \leq f \leq 1$.

The process 100 can continue to block 106. In an embodiment, forming the ion conductive material can include decomposing ammonium halide. In an aspect, decomposition can include separate complex metal halide phase from ammonium halide phase. In another aspect, forming the ion conductive material can further include escaping of ammonium halide.

In an aspect, decomposition may be carried out in a crucible made of a material that is inert to the reactants and products. For example, the crucible may be made of quartz, alumina, silica-alumina, BN, glassy carbon, or graphite. In particular implementations, graphite can have a pyrolytic carbon coating.

In another aspect, decomposition may be conducted at a dry and neutral atmosphere, such as air or dry air. An inert gas, such as $N_2$ or Ar, may be used to facilitate the process.

In a further aspect, decomposition may be performed for at least 15 minutes to at most 24 hours. In an aspect, the solid-state solution may be heated to a temperature in a range from 350° C. to 800° C. to allow partial or full sublimation of ammonium halide. In some instances, sublimation of $NH_4X$ can be monitored by weighing the escaped $NH_4X$ that is collected and condenses at the other side of the In a further aspect, sublimation may be performed such that a majority of ammonium halide, such as at least 60 wt %, at least 80 wt %, or at least 90 wt % of ammonium halide may be removed compared to the weight of the initially added ammonium halide. In a further aspect, essentially of the aluminum halide may be removed by sublimation. In another aspect, sublimation may be performed such that residual ammonium halide may be contained by the ion conductive material.

In another aspect, decomposition of the ammonium-containing complex metal halide can help remove reaction products other than the complex metal halide from the solid-state solution. For instance, water, $CO_2$, ammonia, and halogen may be evaporated.

Alternatively, the starting materials may be heated at a higher temperature so that ammonium-containing complex metal halide may be formed in one step. An exemplary one-step reaction is illustrated below.

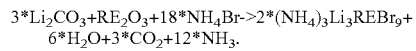
$$3*Li_2CO_3 + RE_2O_3 + 18*NH_4Br \rightarrow 2*(NH_4)_3Li_3REBr_9 + 6*H_2O + 3*CO_2 + 12*NH_3.$$

Particularly, heating can be conducted such that the decomposition of ammonium and solid-state reaction may be carried out simultaneously. For instance, the heating temperature can be in a range from 250° C. to 650° C. or up to 800° C. to allow the formation of the solid-state solution and sublimation of ammonium halide. It has been noted a relatively higher content of oxyhalide may be generated when using the one-step synthesis to form a complex metal halide.

In another embodiment, the process 100 can include forming the ion conductive material including the complex metal halide. In an aspect, the complex metal halide may be represented by $M_{3-z}Me^{k+}X_{3-z+k}$. In another aspect, the complex metal halide may be represented by $M_{3-z}(Me^{k+})_f X_{3-z+k*f}$ wherein $0 \leq f \leq 1$.

In an aspect, after decomposition, cooling may be performed. For example, cooling may be performed in air, dry air, or a nitrogen atmosphere. In another example, the cooling temperature may be below 200° C., such as at most 100° C., at most 70° C., at most 50° C., or at most 30° C. In particular implementations, cooling can be performed in a dry atmosphere at room temperature (e.g., 20 to 25° C.). Optionally, Ar or $N_2$ may be used to facilitate cooling.

In another aspect, the ion conductive material including the complex metal halide may be formed after cooling.

In an embodiment, the complex metal halide may be formed including a particular content of residual ammonium halide. In at least one example, the ion conductive material can include at least 2 ppm of ammonium halide for the total weight of the complex metal halide, such as at least 10 ppm, at least 100 ppm, at least 300 ppm, at least 500 ppm, at least 0.2 wt %, at least 0.5 wt %, or at least 1 wt % of ammonium halide for the total weight of the complex metal halide. In another example, the ion conductive material can include at most 5 wt %, such as at most 3 wt % of ammonium halide for the weight of the complex metal halide. It is to be appreciated that the complex metal halide may include a content of residual ammonium halide in a range including any of the minimum or maximum values noted herein. In at least one example, the complex metal halide may be essentially free of ammonium halide.

In an embodiment, the ion conductive material may be in the form of powder, such as including particles of complex metal halide. In an aspect, the powder can have an average particle size (D50) of at least 0.1 microns, such as at least 0.3 microns, at least 0.5 microns, or at least 1 micron. In another aspect, the average particle size may be at most 1 mm, at most 800 microns, at most 500 microns, at most 200 microns, at most 100 microns, at most 50 microns, at most 10 microns, at most 5 microns, or at most 1 micron. In particular instances, the powder may include particles having an average particle size in a range including any of the minimum or maximum values noted herein. In another aspect, the powder may include agglomerated particles.

In a further aspect, the particles can have a particular shape that can facilitate improved formation and performance of an electrolyte and/or electrode. For example, the particles can be spherical or elongated. In another example, the particles may have the shape of rods, flakes, or needles. The shapes of the particles may be selected depending on 2D or 1D anisotropy in the ion conductivity of the complex metal halide.

In another aspect, the powder can include particles having a particular average aspect ratio of length:width to facilitate the formation of an electrolyte and/or an electrode having improved ion conductivity. In an example, the average aspect ratio can be at least 1, such as at least 1.2, at least 1.5, at least 2, at least 2.3, at least 2.5, at least 2.8, or at least 3. In another example, the average aspect ratio can be at most 30, at most 25, at most 22, at most 20, at most 15, at most 12, at most 10, at most 8, at most 5, or at most 4. Moreover, the particles can have an average aspect ratio in a range including any of the minimum and maximum values noted herein.

In an embodiment, the ion conductive material may include a certain impurity at a relatively low content. The impurity can include simple metal halides including $Me^{k+}X_k$, such as a rare earth halide, alkali halides, such as LiCl and/or NaCl, metal nitrides, such as M3N, and $Me_xN_y$, or any combination thereof. Coefficients x and y are respective valences of N and Me for an electric charge neutral MexNy. In further instances, the impurity can include amine ($NH_2$), imide, hydroxide (OH), ammonia ($NH_3$), or any combination thereof.

In an embodiment, the complex metal halide can be represented by $M_{3-z}(Me^{k+})_fX_{3-z+k*f}$, wherein $-3 \leq z \leq 3$; $2 \leq k \leq 6$; and $0 \leq f \leq 1$. In particular aspects, f is not zero. In particular aspects, z<3. In still particular instances, when f=0, z may not be 3. M can include an alkali metal element; Me can include a divalent metal element, a trivalent metal element, a tetravalent metal element, a pentavalent metal element, hexavalent metal element, or any combination thereof; and X can include a halogen.

In another embodiment, the complex metal halide may be represented by $M_{3-z}Me^{k+}X_{3-z+k}$, wherein $-3 \leq z \leq 3$; M can include an alkali metal element; Me can include a divalent metal element, a trivalent metal element, a tetravalent metal element, a pentavalent metal element, hexavalent metal element, or any combination thereof; and X can include a halogen. In particular aspects, z<3.

In an aspect, M may consist of one or more alkali metal elements including Li, Na, Cs, and Rb. In a further aspect, M can include Li. For example, M can consist of Li. In another aspect, M can include Li and another alkali metal. For instance, M can include Li and at least one of Na, Cs, and Rb. In another instance, M can consist of Li and at least one of Na, Cs, and Rb. In more particular instances, M can consist of a combination of Li and Na. In another aspect, M can include Na, or a combination Na and at least one of Cs an Rb. In another instance, M can consist of at least one of Na and Cs.

In particular implementations, Na can make up at most 40 mol % of M, such as at most 34 mol % of M. For example, M can include from 0 mol % to 40 mol % of Na. In particular examples, M can include up to 20 mol % of Na, or even more particularly, up to 10 mol % of Na. In at least one instance, Na can make up from 40 mol % to 100 mol % of M.

In further particular implementations, Li can make up at least 50 mol % or at least 60 mol % or at least 66 mol % or at least 75 mol % of M. In a particular example, M can include from 60 mol % to 100 mol % Li.

In another instance, Cs can make up at least 25 mol % of M, such as at least 30 mol %, at least 40 mol %, or at least 50 mol % of M. In another instance, Cs may make up at most 50 mol % or at most 40 mol % or at most 30 mol % or at most 20 mol % or at most 10 mol % of M. In particular instances, Cs may make up at most 1 mol % of M.

In an embodiment, the complex metal halide can be represented by $(Li_{1-d}, Na_d)_2Li_{1-z}Me^{k+}X_{3+k-z}$, wherein $0<d<1$; $-0.95 \leq z \leq 0.95$; Me can include a divalent metal element, a trivalent metal element, a tetravalent metal element, a pentavalent metal element, hexavalent metal element, or any combination thereof; and X can include a halogen.

In an embodiment, the complex metal halide represented by $(Li_{1-d-e}, Na_d, M'_e)_2Li_{1-z}(Me^{k+})_fX_{3+k*f-z}$, wherein $0 \leq d \leq 1$; $0 \leq e < 1$; $-3 \leq z' \leq 3$; $2 \leq k < 6$; $0 \leq f \leq 1$; M' can include at least one of K, Rb, and Cs; and Me can include a divalent metal element, a trivalent metal element, a tetravalent metal element, a pentavalent metal element, a hexavalent metal element, or any combination thereof; and X comprises at least a halogen. In particular aspects, z'<3. In particular aspects, d+e>0. In particular aspects, f is not zero. In more particular aspects, e=0, and d is not zero.

In an aspect, d may be at least 0.01 or at least 0.05 or at least 0.1 or at least 0.2. In another aspect, d may be at most 0.8 or at most 0.5. In a particular aspect, d can be in a range including any of the minimum and maximum values.

In an aspect, e may be at least 0.01 or at least 0.05 or at least 0.1 or at least 0.2. In another aspect, e may be at most 0.8 or at most 0.5. In a particular aspect, e can be in a range including any of the minimum and maximum values.

In an embodiment, the complex metal halide represented by $Li_{3-z}Me^{k+}X_{3-z+k}$, wherein $-0.95 \leq z \leq 0.95$; and Me can include a divalent metal element, a trivalent metal element, a tetravalent metal element, a pentavalent metal element, hexavalent metal element, or any combination thereof; and X can include a halogen.

In an aspect, z can be at most 0.5, such as at most 0.3 or at most 0.2. In another aspect, z may be at least −0.5 or at least −0.2. In a particular example, z can be in a range including any of the minimum and maximum values noted herein. When z is not 0, the complex metal halide can be non-stoichiometric. When z is 0, the complex metal halide can be stoichiometric.

An exemplary divalent metal element can include an alkaline earth element, such as Mg and/or Ca, Zn, or any combination thereof. In particular implementations, Me can include Zn, Ca, or any combination thereof. In particular implementations, ions having relatively smaller radii, such as Zn and Mg, may be particularly suitable when the halogen includes or consist of Cl; and ions having relatively larger radii, such as Ca, may be particularly suitable when the halogen includes or consists of Br. In another particular implementation, including a substituting ion having a radius larger than the base ion may help enlarge ion-conducting channels in the electrolyte material. For example, Me can include Ca and Y, wherein Ca can be suitable to partially substitute Y. In another implementation, a divalent element having a relatively light weight, such as Mg, Zn, and Ca, may be preferred. In certain instances, substituting Y with Sr or Ba may result in the formation of compounds of $SrX_2$ or $BaX_2$, which may be an impurity impacting bulk ionic conductivity of the complex metal halide.

An exemplary trivalent metal element can include a rare earth element, a trivalent metal other than a rare earth element, such as In, Ga, Al, or Bi, or any combination thereof. In particular examples, Me can include Sc, Y, La, Gd, or any combination thereof. In more particular instances, Me can include Y, Gd, or a combination thereof.

An exemplary tetravalent metal element can include Zr, Hf, Ti, Sn, Ge, Th, or any combination thereof. In particular examples, Me can include Zr and Hf. In another particular example, Me can include Zr.

An exemplary pentavalent element can include Ta, Nb, W, Sb, or any combination thereof.

In an aspect, Me can include a rare earth element, alkaline earth metal element, 3d transition metal, Zn, Zr, Hf, Ti, Sn, Th, Ge Ta, Nb, Mo, W, Sb, In, Bi, Sc, Yb, Al, Ga, Fe or any combination thereof.

In a further aspect, Me can include a rare earth element, Zr, or any combination thereof.

In another aspect, Me can include Y, Ce, Gd, Er, Zr, La, Yb, In, Mg, Zn, or any combination thereof.

In instances Me includes more than one metal element, k can be the average of the total of the valence of each Me metal element. For example, when Me includes a trivalent element and tetravalent element in equal molar quantity, $k=(3+4)/2=3.5$. In a particular aspect, k may be 3 or 4 or 5.

In a further aspect, Me can include a rare earth element including Y, Gd, La, and/or Sc, an alkaline earth metal element, 3d transition metals, Zn, Zr, Hf, Ti, Sn, Th, Ta, Nb, Mo, W, Sb, In, Bi, Al, Ga, Ge or any combination thereof. In particular examples, Me can include Y, Gd, Zr, or any combination thereof. In particular instances, Me can include Y that is partially substituted by another Me element. For instance, Y may be substituted by a particular content of another Me element that can facilitate improved crystalline structure and property of the complex metal halide. In a particular example, Me can include up to 70 mol % of Y and from 5 mol % to 30 mol % of substitution Me element. In a further example, Y may be partially substituted by an Me element having a suitable effective ionic radius that may allow the formation of a stable phase of the complex metal halide. In a particular example, the Me element may have an ionic radius that is smaller than the effective ionic radius of La, 103.2 A and at least similar to the effective ionic radius of Li, 0.76 A. In more particular examples, the Me element may have an effective ionic radius from 0.76 A±5% to 93.5 A±5%.

In a particular implementation, Me can consist of Gd, Y, Ce, Er, Zr, Yb, or any combination thereof. For example, Me can consist of Y. In another example, Me can consist of Y and at least one of Ce, Er, Zr, and Gd. In a further example, Me consists of Yb and Ce. In another example, Me can consist of two or more of In, Y, Zr, Hf, Sc, Zn, and Mg.

In an aspect, X can include at least one of Cl, Br, I, and F. For example, X can include Cl or Br. In another example, X can include F. In another example, X can include at least two of Cl, Br, and I. In still another example, X can include all of Cl, Br, and I.

In an aspect, X may include elements other than halogen. In some implementations, X can include an anion group in addition to a halogen. Such anion group can include —NH2, —(NH)$_{0.5}$, hydroxide (—OH), —BF4, —BH$_4$ (borohydride), or a combination thereof. The anion group may be included as an impurity or a dopant.

In particular aspects, X can consist of at least one of F, Cl, Br, and I, and optionally, an anion group including —NH$_2$, —(NH)$_{0.5}$, —OH (hydroxide), —BH$_4$ (borohydride), —BF$_4$ groups, or any combination thereof. For example, X can consist of one or both of Cl and Br and at least one anion group. In a further example, X may consist of F and at least one anion group. In at least one embodiment, X may be one or more halogen.

In a particular example, M can be Li, Me can be a combination of In, Mg, Zr, and Sc, and X can be Cl or a combination of Cl and an anion group.

In another particular example, M can be Li, Me can be Y, Zr, and Hf, and X can be Cl or a combination of Cl and an anion group.

In another particular example, M can be Na, Me can be Zr, and X can be Cl or a combination of Cl and an anion group.

In a particular embodiment, the complex metal halide is represented by $(Li_{(1-d-e)}, Na_{(d)}, M'_{(e)})_2Li_{(1-z)}Me^{3+}_{(1-u-p-q-r)} Me^{4+}_{(u)} Me^{2+}_{(p)} Me^{5+}_{(q)}Me^{6+}_{(r)}(Cl_{(1-y-w)} Br_{(y)}I_{(w)})_{(6+u-p+2q+3r-z)}$, wherein $0 \leq d \leq 1$; $0 \leq e < 1$; $-3 \leq z \leq 3$; M' includes at least one of K, Rb, Cs; $M^{3+}$ includes a rare-earth element, In, Bi, Sc, Y, Al, Ga or any combination thereof; $Me^{4+}$ is $Zr^{4+}$, $Hf^{4+}$, $Ti^{4+}$, $Sn^{4+}$, $Th^{4+}$, $Ge^{4+}$ or any combination thereof; $Me^{2+}$ is $Mg^{2+}$, $Zn^{2+}$, $Ca^{2+}$, $Yb^{2+}$, $Eu^{2+}$ or any combination thereof; $Me^{5+}$ is $Ta^{5+}$, $Nb^{5+}$, $W^{5+}$, $Sb^{5+}$, or any combination thereof; $Me^{6+}$ is $W^{6+}$, $Mo^{6+}$, or any combination thereof; $0 \leq w \leq 1$; $0 \leq y \leq 1$; $-0.95 < z < 0.95$; $0 \leq u < 0.95$; $0 \leq p < 0.95$; $0 \leq q < 0.95$; and $0 \leq r < 0.95$.

In particular aspects, $M^{3+}$ can include $Y^{3+}$, $Gd^{3+}$, $In^{3+}$, $Er^{3+}$, $Sc^{3+}$, or any combination thereof. In more particular aspects, $M^{3+}$ can consist of $Y^{3+}$, $Gd^{3+}$, $In^{3+}$, $Er^{3+}$, $Sc^{3+}$, or any combination thereof.

In particular aspects, $M^{4+}$ can include $Zr^{4+}$, $Hf^{4+}$, $Ce^{4+}$, or a combination thereof. In more particular aspects, $M^{4+}$ can consist of $Zr^{4+}$, $Hf^{4+}$, $Ce^{4+}$, or a combination thereof.

In another particular aspect, any one or more of p, q, r, and u can be 0. In more particular aspects, all of p, q, r, and u can be 0.

In a particular aspect, k can be 2 or 3 or 4 or 5.

In another particular aspect, the complex metal halide is represented by $(Li_{(1-d)}, Na_{(d)})_2Li_{(1-z)} RE_{(1-u)} Zr^{4+}_{(u)}(Cl_{(1-y)} Br_{(y)})_{(6+u-z)}$, wherein $0 < d < 1$; $0 < z < 0.95$; and $0 \leq u < 0.95$. In an instance, d may be at least 0.0001, at least 0.001, at least 0.005, at least 0.008, at least 0.01, at least 0.02, at least 0.03, at least 0.05, or at least 0.06. In a further instance, d may be at most 0.5, at most 0.3, at most 0.2, at most 0.1, at most 0.08, at most 0.06, at most 0.05, at most 0.04, or at most 0.03. In a further instance, d may be in a range including any of the minimum and maximum values noted herein. For example, $0 < d < 0.05$. In a further instance, z can be at least 0.02, at least 0.03, at least 0.05, at least 0.07, at least 0.09, at least 0.1, at least 0.15, at least 0.18, or at least 0.2. In another instance, z can be at most 0.5, at most 0.4, at most 0.38, at most 0.35, at most 0.33, at most 0.3, at most 0.28, at most 0.25, at most 0.23, or at most 0.2. Moreover, z can be in a range including any of the minimum and maximum values noted herein. For instance, $0 < z < 0.2$. In another instance, u may be at least 0.01, at least 0.03, at least 0.05, at least 0.07, at least 0.09, at least 0.1, at least 0.13, at least 0.15, at least 0.18, at least 0.2, at least 0.22, at least 0.25 or at least 0.3. In another instance, u may be at most 0.8, at most 0.78, at most 0.75, at most 0.73, at most 0.7, at most 0.68, at most 0.65, at most 0.63, or at most 0.6. Moreover, u can be in a range including any of the minimum and maximum values noted herein. For instance, $0.2<u<0.6$.

In a particular embodiment, the complex metal halide may be doped with a dopant. In particular examples, Li may be partially substituted by a dopant. In more particular examples, the dopant can include ammonium, such as ammonium halide $NH_4X$, wherein X can be Cl, Br, I, F, or any combination thereof.

In an aspect, the complex metal halide can include ammonium halide of at most 20 wt % for the total weight of the complex metal halide, such as at most 15 wt %, at most 10 wt %, at most 8 wt %, at most 5 wt %, or at most 3 wt % of ammonium halide for the total weight of the complex metal halide. In another aspect, ammonium halide may be present in the ion conductive material in a content of at least 10 ppm by mass of ammonium halide for the total weight of the complex metal halide, such as at least 100 ppm, at least 500 ppm, at least 0.1 wt %, at least 0.3 wt %, at least 0.5 wt %, at least 0.8 wt %, or at least 1 wt % of ammonium halide for the total weight of the complex metal halide. Moreover, the complex metal halide can include ammonium halide in a content in a range including any of the minimum and maximum values noted herein.

Figure 2:
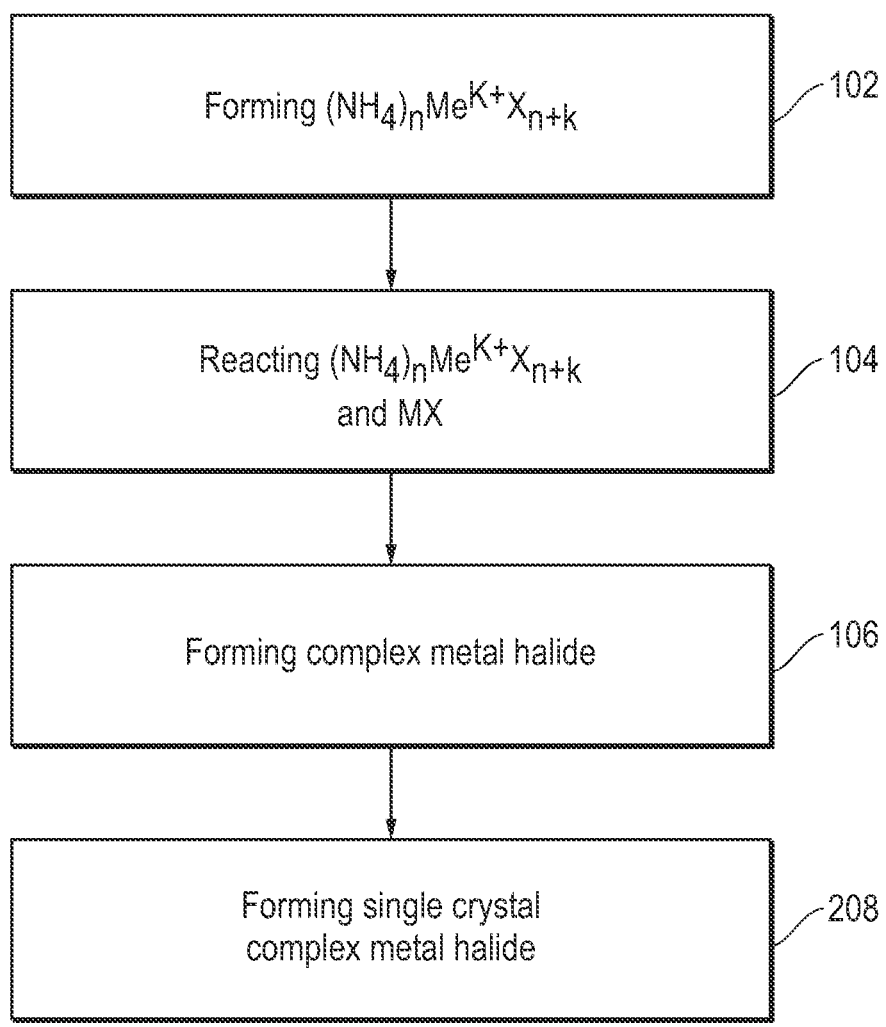
FIG. 2 includes a flowchart illustrating a process of forming a solid ion conductive material according to another embodiment.

Referring to FIG. 2, an exemplary process 200 for forming a solid ion conductive material is illustrated. The process 200 can include steps similar to steps illustrated in blocks 102, 104, and 106 of FIG. 1 and described in embodiments with respect to the process 100.

The process 200 can continue to block 208 after obtaining the complex metal halide at block 106. In an embodiment, the process 200 can include forming a solid ion conductive material including a single crystal material including the complex metal halide. In an aspect, crystal growth may be carried out in a crucible made of a material that is inert to the complex metal halide. For example, the crucible may be made of quartz, alumina, silica-alumina, BN, glassy carbon, or graphite. In particular implementations, graphite can have a pyrolytic carbon coating.

The complex metal halide obtained by the process 100 can be directly used as a charge to form a single crystal. In an aspect, the process 200 can include partially or fully melting complex metal halide. In some instances, a dopant material, such as a metal compound, may be added to the melt to facilitate substitutions of one or more metal elements of the complex metal halide.

In a further aspect, the process 200 can include a particular crystal growth rate that can facilitate the growth of single crystals having a macroscopic size, such as a monocrystalline block of up to 10 centimeters. For example, the growth rate can be at least 0.2 mm/hour, at least 0.3 mm/hour, or at least 0.5 mm/hour. In another instance, the growth rate can be at most 10 mm/hour, such as at most 8 mm/hour, at most 6 mm/hour, at most 5 mm/hour, at most 3 mm/hour, or at most 1 mm/hour. In a particular instance, the growth rate can be in a range including any of the minimum and maximum values noted herein.

In another aspect, the process 200 can include cooling the melt. In particular aspects, cooling can be conducted in a controlled manner to support the formation of a single crystal having the complex metal halide. In particular instances, cooling can be facilitated by an external thermal field with a cooling rate of 10° C./hour to 50° C./hour. In another particular instance, the starting material of the complex metal halide may form an incongruent melting phase due to the presence of an impurity, such as a simple metal halide, and in those instances, the melt can include a mixture of off-stoichiometry including the complex metal halide and a dopant material in an excessive amount to facilitate the formation of stoichiometric single-phase crystals at self-flux conditions.

The single crystal can have the same composition as the complex metal halide formed by the process 100 and described in the embodiments herein.

The single crystals can be smaller chunks of the order of a few millimeters or a densified block or large ingots up to tens of centimeters in size.

In an embodiment, the ingots or blocks may be ground to remove visible impurity and/or parasitic phases when they are present.

In a further embodiment, the single crystal may be ground to form fine powder having single crystal particles. In an exemplary application, single crystal particles may be used to form an ion conductive component in an electrochemical device. In another embodiment, the single crystal ingot or block may be sliced into thin sheets. For instance, the thin sheet can have a thickness from 5 microns to 500 microns.

In a particular embodiment, the process 200 can include forming a single crystal having a particular crystallographic orientation. In an aspect, oriented growth of the single crystal can be performed. In particular aspects, oriented crystal growth can be conducted for crystals that are anisotropic. In an exemplary implementation, crystallization of pellets or particles elongated in the crystallographic direction with higher conductivity can be conducted. In another example, a high-temperature gradient, such as 10° C./cm or higher, may be applied to facilitate the oriented growth of a single crystal. In a further example, an X-ray goniometer can be used to identify the orientation of the crystal. In another aspect, oriented crystal growth may be conducted using a strong permanent magnetic field, solidification under a strong electric field, or any combination thereof, for crystals that are anisotropy for magnetic permeability or dielectric constant. In still another aspect, utilizing a supporting seeding layer having a lattice parameter close to the oriented ceramics material and solidification in the flux media may help keep the oriented polycrystalline structure.

In another aspect, a single crystal can be sliced such that the crystallographic direction with a higher conductivity may be in the thickness direction of the thin sheet.

In a particular embodiment, the ion conductive material can include an oriented crystalline material, such as a monocrystalline material having a crystallographic orientation represented by <HKL> or <HKLM>, wherein an ionic conductivity in the crystallographic orientation of <HKL> or <HKLM> is higher than an ionic conductivity in a different crystallographic orientation that the single crystal may be oriented.

For example, $Li_3YBr_6$ has a higher ion conductivity in the crystallographic orientation <100> compared to <001>. A $Li_3YBr_6$ single crystal having the crystallographic orientation of <100> may be formed to have higher bulk ion conductivity. Alternatively, a slice of $Li_3YBr_6$ having a cut surface extending in crystallographic orientation of <001> may be formed from a single crystal, and the thickness of the slice extends in the crystallographic orientation of <100>.

Figure 3A:
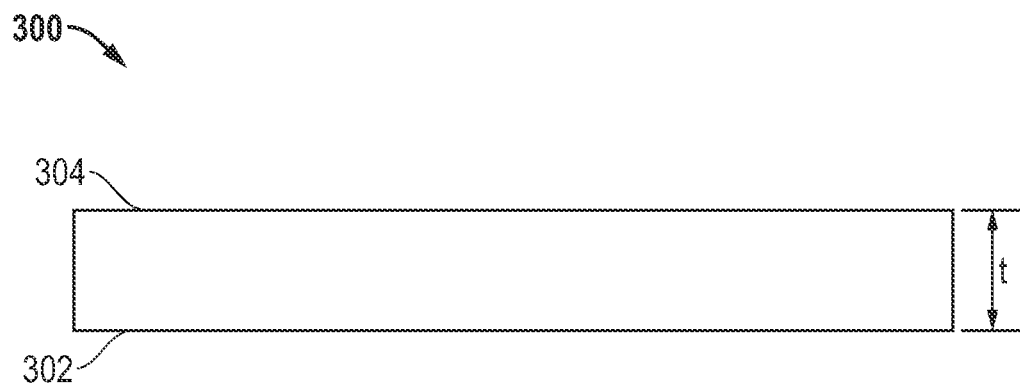
FIG. 3A includes a cross-sectional illustration of a solid ion conductive material according to an embodiment.
Figure 3B:
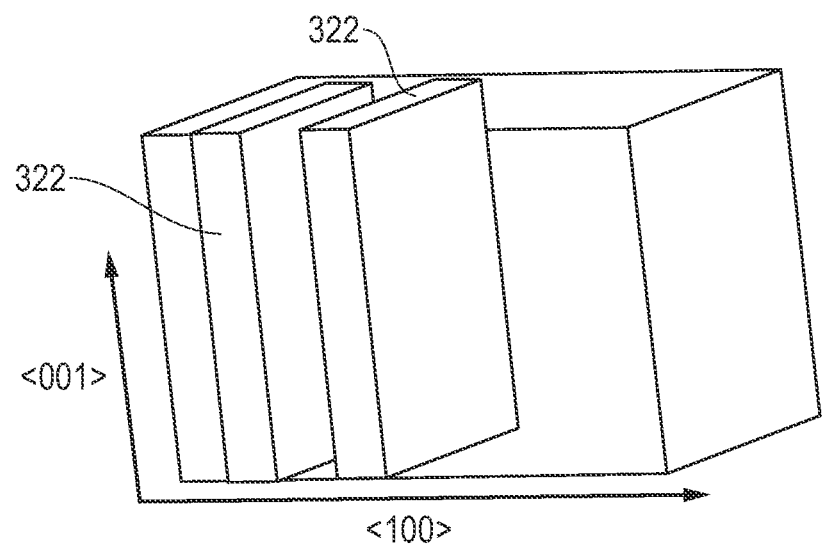
FIG. 3B includes an illustration of exemplary crystallographic orientations of the solid ion conductive material of FIG. 3A.

Referring to FIG. 3A, a sheet 300 is illustrated. In an embodiment, the sheet 300 can include the single crystal described in embodiments herein. The sheet 300 can have a thickness t extending between the major surfaces 302 and 304. FIG. 3B includes an exemplary illustration of the crystallographic orientations of the single crystal. The single crystal can have a mika-like layered structure, wherein the length of the layers extends in the crystallographic direction <100> and the stack of layers extends in the crystallographic direction <001>. The particular single crystal can have greater ion conductivity in the crystallographic direction <100> compared to <001>. In particular instances, the thickness t of the sheet 300 can extend in the direction of crystallographic direction <100>. In further instances, one or both of the major surfaces of 302 and 304 can be a sliced surface. Alternatively, the sheet 300 can be formed by oriented crystal growth to have the crystallographic orientation, wherein the thickness t extends in the crystallographic direction <100>.

It is notable the forming processes of embodiments herein can allow the formation of the ion conductive material having higher purity. It is further notable the ion conductive material with a higher purity can have further improved ion conductivity.

Using a conventional method, such as ball-milling-based solid-state reaction, to form a complex metal halide can result in higher contents of impurities, such as simple metal halide. When using complex metal halide having higher contents of simple metal halide contamination or directly using simple compounds as the starting material to grow crystals following the process of Bridgman-Stockbarger, Gradient-Freeze, Czochralski, or Bagdasarov (Horizontal Bridgman), the melt displays incongruent melting and formation of higher contents of impurity and parasitic phases in resulted crystals. The impurity and parasitic phases include one or more simple metal halide, such as LiX and $Me^{k+}X_k$, wherein X is a halogen, such as Cl and/or Br.

The processes of embodiments herein can allow the formation of complex metal halide with low content of impurity. In an embodiment, the complex metal halide can have a total content of simple metal halide of at most 15 wt % for the total weight of the complex metal halide, such as at most 12 wt %, at most 11 wt %, at most 10 wt %, at most 9 wt %, at most 8 wt %, at most 7 wt %, at most 6 wt %, at most 5 wt %, at most 4 wt %, at most 3 wt %, at most 2 wt %, at most 1 wt %, or at most 0.5 wt % for the total weight of the complex metal halide. In particular embodiments, the single crystal of complex metal halide can be essentially free of simple metal halides. For instance, the total content of all simple metal halides may be less than 0.2 wt % for the weight of the single crystal. It is also notable that the complex metal halide of embodiments herein has higher bulk ion conductivity compared to that made using conventional methods.

In an embodiment, performing crystal growth can facilitate further purification of the complex metal halide. In further instances, crystal growth can facilitate the formation of the ion conductive material with improved bulk ion conductivity. It is notable a single crystal of the complex metal halide of embodiments herein tends to have further improved bulk ion conductivity compared to non-single crystal form (e.g., powder) having the same complex metal halide of embodiments herein.

In at least one embodiment, a single crystal of embodiments herein may include a low content of impurity of nitride-based phase. Nitride-based phase can include one or more phases of metal nitride, metal oxynitride, metal carbon nitride, or any combination thereof. The formation of nitride-based phase may result from the process 100, the process 200, or a combination thereof. In some instances, the presence of a particular species of metal nitride, such as $Li_3N$ may help improve bulk ion conductivity of the metal halide material.

Figure 4:
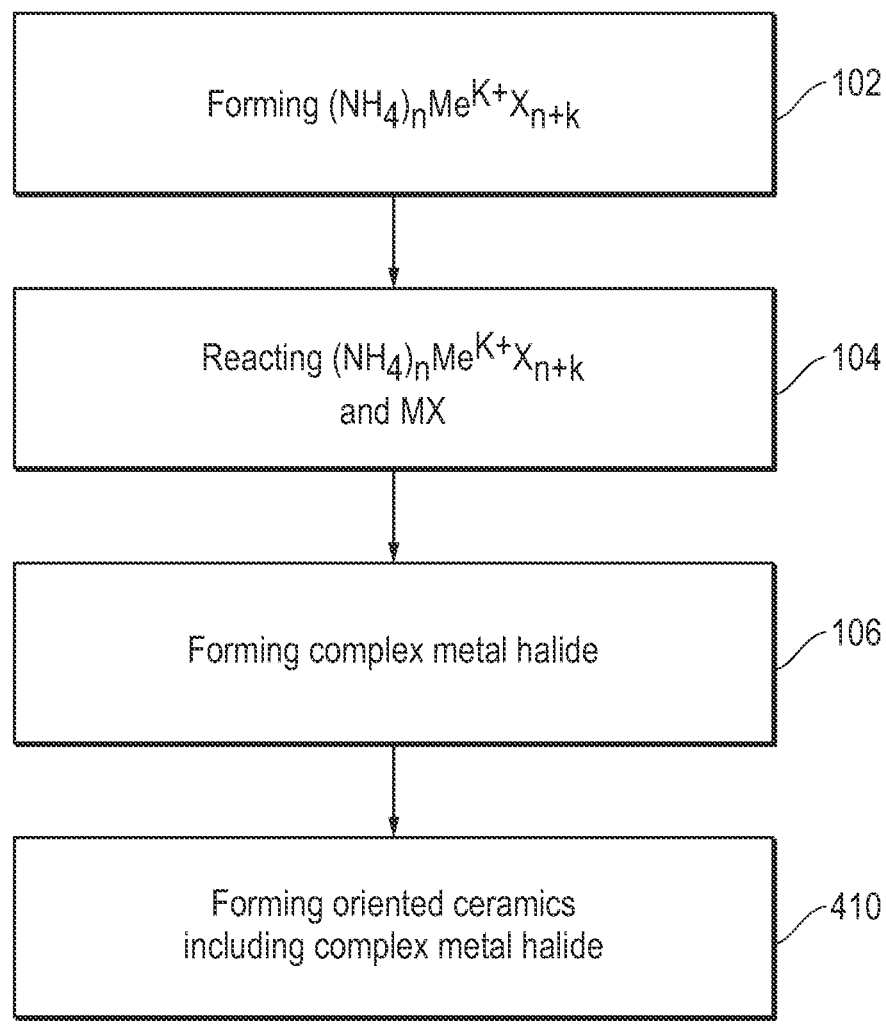
FIG. 4 includes a flowchart illustrating a process of forming a solid ion conductive material according to an embodiment.

Referring to FIG. 4, a process 400 for forming an ion conductive material is illustrated. The process 400 can include all the steps illustrated in FIG. 1 and described in embodiments with respect to the process 100. The process 400 can include an additional step illustrated in block 410.

In an embodiment, the process 400 can include forming a solid conductive material including an oriented ceramic material. In an aspect, the particles of complex metal halide formed by the process 100 may be used. In an instance, the particles can have a particular shape, such as an elongated shape, and may be arranged such that the longitudinal axis of the particles extends in parallel in the direction of the crystallographic orientation with higher ion conductivity. In another instance, casting, compacting, pressing, heating, molding, or any combination thereof, may be used to facilitate orienting the particles. In another instance, a magnetic field, electric discharge, thermal gradient, or a combination thereof may be used to facilitate the crystal orientation of the ceramic particles.

In another embodiment, the process 400 can include performing crystal growth to form an oriented ceramic. In an aspect, the process 400 can include forming a melt similar to process 200. In a further aspect, crystal growth can be conducted at a particular growth rate. For example, the growth rate may be at least 8 mm/hour, at least 10 mm/hour, at least 15 mm/hour, or at least 20 mm/hour. In another instance, the growth rate can be at most 80 mm/hour, at most 70 mm/hour, at most 60 mm/hour, at most 50 mm/hour, or at most 40 mm/hour. IN another instance, the growth rate can be in a range including any of the minimum and maximum values noted herein. In another aspect, a thermal gradient can be applied to facilitate the growth of an oriented polycrystalline crystal.

In an embodiment, the process 400 can include forming a single crystal as described in embodiments related to the process 200. In an aspect, single crystal pellets may be arranged to form a ceramic ion conductive material having a particular crystallographic orientation. In an example, casting, compacting, pressing, heating, molding, or any combination thereof, may be used to facilitate the formation of crystal-orientated ceramic ion conductive material. In a particular instance, the single crystal pellets can be oriented and having the preferred crystallographic orientation.

In an example, a complex metal halide can be anisotropic having higher ion conductivity in the crystallographic orientation <100> and ion conductivity in the crystallographic orientation lower <001>. Referring to FIG. 3B, single crystal or ceramic pellets of the complex metal halide 322 can be arranged as illustrated to form a crystal-oriented ceramic material.

The solid ion conductive material of embodiments herein can be in different forms. In an embodiment, the ion conductive material can include powder including the complex metal halide. In another embodiment, the ion conductive material can include a single crystal of the complex metal halide. For instance, the ion conductive material can include a powder including single crystal particles. In another instance, the ion conductive material can include a monocrystalline sheet, a monocrystalline film, a monocrystalline block, a monocrystalline ingot, or a single crystal in another form, or any combination thereof. In a further embodiment, the ion conductive material can include a ceramic material including the complex metal halide. For instance, the ceramic material may include ceramic particles, single crystal particles, or any combination thereof.

In another embodiment, the solid ion conductive material can be polycrystalline, monocrystalline, or a crystallographic oriented crystalline material. For instance, the solid conductive material can be a single crystal of complex metal halide. In another instance, the solid conductive material can be a ceramic consisting of single crystals of complex metal halide. In another instance, the solid conductive material can be a crystallographic oriented crystalline material of the complex metal halide.

In an embodiment, the solid ion conductive material may include a content of impurity. Impurity may be present as a different phase than the complex metal halide or complexed with metal halide in the same phase. For instance, a simple metal halide may be present in a separate phase than the complex metal halide. In instances, ammonium halide may be fully or partially complexed with the complex metal halide. In particular, the solid ion conductive material can include improved purity compared to a conventional solid ion conductive material that may be represented by the same general formula but is formed using a process different than the processes noted in embodiments herein. For instance, the total of the contents of all the impurities (also referred to as "the total content of impurity") may make up at most 15 wt % for the weight of the complex metal halide in the solid ion conductive material of embodiments herein. For example, the total content of impurity can be at most 14 wt % for the weight of the complex metal halide, such as at most 13 wt %, at most 12 wt %, at most 11 wt %, at most 10 wt %, at most 9 wt %, at most 8 wt %, at most 7 wt %, at most 6 wt %, at most 5 wt %, at most 4 wt %, at most 3 wt %, at most 2 wt %, at most 1 wt %, at most 0.5 wt %, at most 0.3 wt %, at most 0.1 wt %, at most 500 ppm, at most 300 ppm, at most 100 ppm, at most 50 ppm, at most 40 ppm, at most 30 ppm, at most 20 ppm, or at most 10 ppm for the weight of the complex metal halide. In another instance, the complex metal halide can include a total content of impurity of at least 0.2 ppm for the weight of the complex metal halide, such as at least 0.5 ppm, at least 1 ppm, or at least 2 ppm for the weight of the complex metal halide. In another aspect, the total content of impurity may be in a range including any of the minimum or maximum values noted herein.

Content of impurity phase can be determined as follows. The phase for each impurity can be detected by XRD analysis coupled with Rietveld refinements for quantitative analysis through the presence of characteristic diffraction peaks corresponding to the parasitic phases. Rietveld Refinements (RR) can analyze the shape and position of the peaks at an XRD diagram to identify quantitatively the contribution of the various phases by collecting the 2□ data at XRD diffraction with a small incrementation of 2□ angle and converting the XRD data into a ratio of different phases.

For nitride-based impurity phase, LECO analysis may also be used to determine the presence and quantify the phase, particularly when the nitride-based impurity phase is present at below 0.1% at the molar or mass quantity. LECO analysis is based on combustion of the sample and analyzing the presence of nitrogen (or also sulfur, carbon, hydrogen, oxygen) through boiled material gas thermal conductivity or Infra-Red absorption diagrams.

In a further aspect, the content of all nitride-based impurity phase, such as metal nitride, metal oxynitride, and/or metal-carbon nitride, present in the ion conductive material can be at most 0.5 wt % for the weight of the complex metal halide, such as at most 0.3 wt %, at most 0.2 wt %, at most 0.1 wt %, at most 500 ppm, at most 300 ppm, at most 100 ppm, at most 50 ppm, at most 40 ppm, at most 30 ppm, at most 20 ppm, or at most 10 ppm for the weight of the complex metal halide. In another instance, the content of all metal nitride can be at least 0.2 ppm for the weight of the complex metal halide, such as at least 0.5 ppm, at least 1 ppm, or at least 2 ppm for the weight of the complex metal halide. In another aspect, the content of all nitride-based phases may be in a range including any of the minimum or maximum values noted herein.

In a further aspect, the content of alkali halide (MX) can be at most 10 wt % for the weight of the complex metal halide, such as at most 9 wt %, at most 8 wt %, at most 7 wt %, at most 6 wt %, at most 5 wt %, at most 4 wt %, at most 3 wt %, at most 2 wt %, at most 1 wt %, at most 0.5 wt %, at most 0.3 wt %, at most 0.2 wt %, at most 0.1 wt %, at most 500 ppm, at most 300 ppm, at most 100 ppm, at most 50 ppm, at most 40 ppm, at most 30 ppm, at most 20 ppm, or at most 10 ppm for the weight of the complex metal halide. In another instance, the content of MX can be at least 0.2 ppm for the weight of the complex metal halide, such as at least 0.5 ppm, at least 1 ppm, or at least 2 ppm for the weight of the complex metal halide. In another aspect, the content of MX may be in a range including any of the minimum or maximum values noted herein.

In a further aspect, the content of metal oxyhalide (MeOX), such as rare earth oxyhalide, can be at most 5 wt % for the weight of the complex metal halide, such as at most 4 wt %, at most 3 wt %, at most 2 wt %, at most 1 wt %, at most 0.5 wt %, at most 0.3 wt %, at most 0.2 wt %, at most 0.1 wt %, at most 500 ppm, at most 300 ppm, at most 100 ppm, at most 50 ppm, at most 40 ppm, at most 30 ppm, at most 20 ppm, or at most 10 ppm for the weight of the complex metal halide. In another instance, the content of MeOX phase can be at least 0.2 ppm for the weight of the complex metal halide, such as at least 0.5 ppm, at least 1 ppm, or at least 2 ppm for the weight of the complex metal halide. In another aspect, the content of MeOX phase may be in a range including any of the minimum or maximum values noted herein. In particular aspects, the complex metal halide can be essentially free of MeOX.

In a further aspect, the content of metal nitride $Me_xN_k$ can be at most 0.3 wt % for the weight of the complex metal halide, such as at most 0.1 wt %, at most 500 ppm, at most 300 ppm, at most 100 ppm, at most 50 ppm, at most 40 ppm, at most 30 ppm, at most 20 ppm, or at most 10 ppm for the weight of the complex metal halide. In another instance, the content of metal nitride can be at least 0.2 ppm for the weight of the complex metal halide, such as at least 0.5 ppm, at least 1 ppm, or at least 2 ppm for the weight of the complex metal halide. In another aspect, the total content of metal nitride $Me_xN_k$ may be in a range including any of the minimum or maximum values noted herein.

In a further aspect, the content of metal nitride $M_xN$ can be at most 0.3 wt % for the weight of the complex metal halide, such as at most 0.1 wt %, at most 500 ppm, at most 300 ppm, at most 100 ppm, at most 50 ppm, at most 40 ppm, at most 30 ppm, at most 20 ppm, or at most 10 ppm for the weight of the complex metal halide. In another instance, the content of metal nitride can be at least 0.2 ppm for the weight of the complex metal halide, such as at least 0.5 ppm, at least 1 ppm, or at least 2 ppm for the weight of the complex metal halide. In another aspect, the total content of metal nitride MeN may be in a range including any of the minimum or maximum values noted herein.

In this disclosure, the total content of nitride-based phase and the content of metal nitrides, such as alkali nitride and $Me_xN_k$, can be detected using the following methods. The ion conductive material can be dissolved in the water, as complex metal halide can be hygroscopic. Metal nitride is not hygroscopic and can be collected and analyzed after filtering the aquatic solution. X-ray diffraction analysis can be used to detect metal nitride at the content of above 0.2 wt %. For the content lower than 0.2 wt %, LECO can be used.

For the content of simply metal halide, X-ray diffraction can be used to analyze the ion conductive material without dissolving the ion conductive material.

In particular instances, the solid ion conductive material can include $NH_3$, $NH_4X$, or a combination thereof, wherein X includes a halogen. In an example, $NH_3$ and/or $NH_4X$ may be present as a separate phase in addition to the complex metal halide. In another example, $NH_3$ and/or $NH_{4X}$ may be a dopant or an impurity of the complex metal halide.

In still another instance, the solid ion conductive material can include $Li_4(NH_2)_3Cl$, $Li_7(NH_2)_6Cl$, $Li_2Br(NH_2)$, $Li_{13}[NH]_6Cl$, $LiCl·NH_3$, $LiBr·4NH_3$, or a combination thereof. In an instance, one or more of the compounds may be present in separate phases in addition to the complex metal halide. In another example, one or more of the compounds may be a by-product resulted from the process 100, 200, and/or 400. In another example, the compounds may be a dopant or an impurity present of the complex metal halide.

In an embodiment, the ion conductive material can have a bulk ion conductivity, measured by electrochemical impedance spectroscopy performed on pelletized samples sandwiched between ion-blocking electrodes, of at least 0.01 mS/cm, such as at least 0.05 mS/cm, at least 0.08 mS/cm, or at least 0.1 mS/cm, or at least 0.3 mS/cm, or at least 0.5 mS/cm. In particular examples, the bulk ion conductivity can be at least 0.6 mS/cm, at least 1.2 mS/cm, at least 1.8 mS/cm, or at least 2.2 mS/cm. In another example, the bulk ion conductivity can be at most 15 mS/cm, at most 13 mS/cm, at most 11 mS/cm, at most 8 mS/cm, at most 7.2 mS/cm, or at most 6.2 mS/cm at. In a particular example, the bulk ion conductivity can be in a range including any of the minimum and maximum values noted herein. The bulk ion conductivity may be measured at room temperature, such as 22° C., and at activation energy in the range of 0.2 eV and 0.5 eV. In further instances, the activation energy from 0 to 1 eV may be used for the temperature from 200° C. to −80° C. For the temperature from 80° C. to −30° C., the activation energy may be from 0.1 to 0.6 eV. For above 0° C. or below 10° C., the activation energy can be from 0.1 to 0.5 eV.

In an embodiment, a solid-state electrolyte can include the ion conductive material. The ion conductive material can be single crystal, polycrystalline, or a combination thereof. The solid-state electrolyte can have improved ion conductivity compared to solid-state electrolyte including conventionally formed complex lithium-based metal halide. In a particular example, the solid-state electrolyte can consist of the ion conductive material. In more particular examples, the solid-state electrolyte can consist of the single crystal complex metal halide, polycrystalline complex metal halide, or oriented crystalline complex metal halide including single crystal having a particular crystallographic orientation or oriented ceramics. In particular applications, an electrolyte may include the crystallographic oriented solid ionic conductive material, wherein the electrolyte may have a thickness extending in the direction that is parallel to the orientation of the solid ionic conductive material.

In an embodiment, a composite ion conductive layer can include the ion conductive material and an organic material. The organic material can include as a binder material, a polymeric electrolyte material, or a combination thereof. In another example, the composite ion conductive layer may include a plasticizer, a solvent, or a combination thereof. An exemplary organic material can include polytetrafluoroethylene (PTFE), polyvinylidene fluoride (PVdF), fluorine rubber, polypropylene, an ethylene-propylene-diene monomer (EPDM), sulfonated EPDM, natural butyl rubber (NBR), paraffin wax, polypropylene carbonate, polyisobutylene, polyvinyl pyrrolidone, polymethyl methacrylate, poly(propylene oxide), polyvinyl chloride, poly(vinylidene fluoride), poly(acrylonitrile), poly(dimethylsiloxane), poly[bis (methoxy ethoxyethoxide)-phosphazene], polyethylene carbonate, polypropylene glycol, polycaprolactone, poly(trimethylene carbonate), hydrogenated nitrile butadiene rubber, poly(ethylene vinyl acetate), high density polyethylene, low density polyethylene, polyurethane, or any combination thereof. In another example, the composite ion conductive layer can include a lithium salt. An exemplary lithium salt can include $LiSbF_6$, $LiN(SO_2CF_3)_2$, $LiN(SO_2C_2F_5)_2$, $LiN(SO_2CF_3)(SO_2C_4F_9)$, $LiC(SO_2CF_3)_3$, $LiAsF_6$, $LiClO_4$, $LiPF_6$, $LiBF_4$, $LiCF_3SO_3$, or any combination thereof.

In another embodiment, a mixed electron and ion conductive layer can include the ion conductive material. In an aspect, the mixed electron and ion conductive layer can further include a cathode active material. An example of the cathode active material can include, but not limited to, lithium-containing transition metal oxides, such as $Li(Ni-CoAl)O_2$ and $LiCoO_2$, transition metal fluorides, polyanions, and fluorinated polyanion materials, and transition metal sulfides, transitions metal oxyfluorides, transition metal oxysulfides, transition metal oxynitrides, or the like, or any combination thereof.

In another aspect, the mixed ion and electron conductive layer can include an anode active material. An exemplary anode active material can include carbon materials, such as artificial graphite, graphite carbon fibers, resin baking carbon, pyrolytic vapor-grown carbon, coke, mesocarbon microbeads (MCMB), furfuryl alcohol resin-baked carbon, polyacene, pitch-based carbon fibers, vapor-grown carbon fibers, natural graphite, non-graphitizable carbon, or the like, metal materials including lithium metal, lithium alloy, or the like, oxides, nitrides, tin compounds, silicon compounds, or any combination thereof.

In some instances, the mixed ion and electron conductive layer can include an electron conductive additive. An example of the electron conductive additive can include carbon fiber, carbon powder, stainless steel fiber, nickel-coated graphite, or the like, or any combination thereof.

Figure 5:
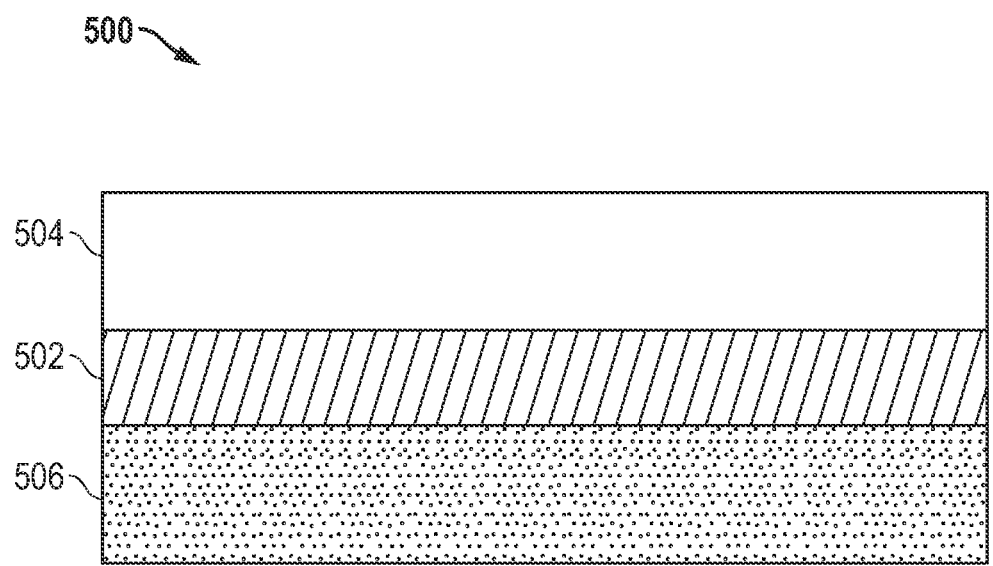
FIG. 5 includes a cross-sectional illustration of a portion of a solid-state battery according to an embodiment.

In an embodiment, a solid-state lithium battery can include an electrolyte disposed between an anode and a cathode. Referring to FIG. 5, a portion of a cross-section of an exemplary solid-state battery 500 is illustrated. The electrolyte layer 502 can be any of the electrolyte or composite layers noted in embodiments herein. The anode 504 overlies the electrolyte 502. In an embodiment, the anode 504 can include the solid ion conductive material and an anode active material. In particular instances, the anode 504 may be a 3 dimensionally structured anode. In another embodiment, the anode 504 may be a metal anode. For instance, the anode may consist of lithium. The cathode 506 may be disposed on the other side of the electrolyte 502 opposite the anode 504. The cathode 506 can include the solid electrolyte material and an active cathode material. In a particular embodiment, the cathode 506 may be a 3 dimensionally structured cathode.

In a particular example, the electrolyte 502 can be the single crystal sheet 300 illustrated in FIG. 3. The anode 504 can be overlying the major surface 304 illustrated in FIG. 3. The major surface 302 is illustrated in FIG. 3 can be over the cathode 506.

Known techniques can be used to form an electrolyte, a composite ion conductive layer, an anode, a cathode, or another component of a solid-state lithium battery with the solid electrolyte material. Such techniques include, but are not limited to, casting, molding, deposition, printing, pressing, heating, or the like, or any combination thereof. In particular implementations, for forming a multi-layer structure, the layers, such as electrolyte and anode and/or cathode may be formed separately and then laminated to form a multi-layer structure. Alternatively, a stack of green electrolyte and anode and/or cathode layers may be formed followed by a further treatment, such as pressing, heating, drying, or any combination thereof to form the finally formed multi-layer structure.

In particular embodiments, the single-crystal block or ingot can be processed together with cathode or anode active materials, for example, by mechanical pressing or by thermally-activated co-extrusion, to ensure intimate electrode to electrolyte contact.

In another particular embodiment, the single crystal block and ingot may be grown directly around the particles of the anode and/or cathode active materials to form a mixed electron and ion conductive layer. In an aspect, a mixed ion and electron conductive layer can include the single-crystal ion conductive material including inclusions including an anode or cathode active material. In another aspect, a mixed ion and electron conductive layer can include an anode or cathode active material that is densely packed within a single crystal ingot or block.

Many different aspects and embodiments are possible. Some of those aspects and embodiments are described herein. After reading this specification, skilled artisans will appreciate that those aspects and embodiments are only illustrative and do not limit the scope of the present invention. Embodiments may be in accordance with any one or more of the embodiments as listed below.

EMBODIMENTS

Embodiment 1. A solid ion conductive material, comprising a complex metal halide, wherein:
the complex metal halide is doped with a dopant including ammonium; and
the complex metal halide is represented by $M_{3-z}(Me^{k+})_f X_{3-z+k*f}$, wherein:
$-3 \leq z < 3$;
$2 \leq k < 6$;
$0 \leq f \leq 1$;
M comprises an alkali metal element;
Me comprises a divalent metal element, a trivalent metal element, a tetravalent metal element, a pentavalent metal element, a hexavalent metal element, or any combination thereof; and
X comprises a halogen.

Embodiment 2. A solid ion conductive material, comprising:
a complex metal halide represented by $M_{3-z}(Me^{k+})_f X_{3-z+k*f}$, wherein:
$-3 \leq z < 3$;
$2 \leq k < 6$;
$0 \leq f \leq 1$;
M comprises an alkali metal element;
Me comprises a divalent metal element, a trivalent metal element, a tetravalent metal element, a pentavalent metal element, a hexavalent metal element, or any combination thereof; and X comprises a halogen; and
at least one of the electric charge neutral $Me_x N_k$ or $M_x N$, wherein x is a valence of N and k is the valence of Me.

Embodiment 3. The solid ion conductive material of embodiment 1 or 2, wherein the complex metal halide is represented by $(Li_{1-d-e}, Na_d, M'_e)_2 Li_{1-z}(Me^{k+})_f X_{3+k*f-z}$, wherein:
$0 \leq d \leq 1$;
$0 \leq e < 1$;
M consists of at least one of Li, Na, and M'; and
M' consists of at least one of K, Rb, and Cs.

Embodiment 4. A solid ion conductive material, comprising a complex metal halide represented by $(Li_{1-d-e}, Na_d, M'_e)_2 Li_{1-z}(Me^{k+})_f X_{3+k*f-z}$, wherein:
$-3 \leq z < 3$;
$2 \leq k < 6$;
$0 \leq f \leq 1$;
$0 < d \leq 1$;
$0 \leq e < 1$;
M comprises an alkali metal element;
Me comprises a divalent metal element, a trivalent metal element, a tetravalent metal element, a pentavalent metal element, a hexavalent metal element, or any combination thereof; and X comprises a halogen; and
at least one of electric charge neutral $Me_x N_k$ or $M_x N$, wherein x is a valence of N and k is the valence of Me;
M consists of at least one of Li, Na, and M'; wherein M' consists at least one of K, Rb, and Cs.

Embodiment 5. The solid ion conductive material of any one of embodiments 1 to 4, wherein z is between −0.95 and 0.95 and M consists of Na and Li.

Embodiment 6. The solid ion conductive material of any one of embodiments 1 to 5, wherein Me comprises one or more of a rare earth element, alkaline earth metal element, 3d transition metal, Zn, Zr, Hf, Ti, Sn, Th, Ge, Ta, Nb, Mo, W, Sb, In, Bi, Al, Ga, Fe or any combination thereof.

Embodiment 7. The solid ion conductive material of any one of embodiments 1 to 6, wherein Me comprises a rare earth element, Zr, or any combination thereof.

Embodiment 8. The solid ion conductive material of any one of embodiments 1 to 7, wherein Me comprises Y, Ce, Gd, Er, Zr, La, Yb, In, Mg, Zn, or any combination thereof.

Embodiment 9. The solid ion conductive material of any one of embodiments 1 to 8, wherein X consists of at least one of F, Cl, Br, and I, and optionally, an anion group including —NH$_2$, —(NH)$_{0.5}$, —OH (hydroxide), —BH$_4$ (borohydride), —BF$_4$ groups, or any combination thereof.

Embodiment 10. The solid ion conductive material of any one of embodiments 1 to 9, wherein Me consists of Gd, Y, or a combination thereof.

Embodiment 11. The solid ion conductive material of any one of embodiments 1 to 9, wherein Me consists of Ce, Y, or a combination thereof.

Embodiment 12. The solid ion conductive material of any one of embodiments 1 to 9, wherein Me consists of Er, Y, or a combination thereof.

Embodiment 13. The solid ion conductive material of any one of embodiments 1 to 9, wherein Me consists of Yb, Ce, or a combination thereof.

Embodiment 14. The solid ion conductive material of any one of embodiments 1 to 9, wherein Me consists of Y, Zr, or a combination thereof.

Embodiment 15. The solid ion conductive material of any one of embodiments 1 to 9, wherein Me consists of two or more of In, Y, Zr, Hf, Sc, Zn, and Mg.

Embodiment 16. The solid ion conductive material of any one of embodiments 1 to 15, wherein the halogen consists of one of Cl, Br, I, and F.

Embodiment 17. The solid ion conductive material of any one of embodiments 1 to 16, wherein the halogen consists of at least two or more of Cl, Br, I, and F.

Embodiment 18. The solid ion conductive material of any one of embodiments 1 to 17, wherein the halogen consists of Cl, Br, and I.

Embodiment 19. The solid ion conductive material of any one of embodiments 1 and 4 to 18, wherein the complex metal halide is represented by Li3−zMek+X3−z+k, wherein Me comprises a rare earth element, Zr, or any combination thereof.

Embodiment 20. The solid ion conductive material of any one of embodiments 1 to 18, wherein the complex metal halide represented by $(Li_{1-d}Na_d)_2Li_{1-z}Me^{k+}X_{3+k-z}$, wherein Me comprises a rare earth element, Zr, or a combination thereof; and $0 \leq d < 1$, $-0.95 \leq z = < 0.95$.

Embodiment 21. The solid ion conductive material of any one of embodiments 1 to 20, wherein $z \leq 0.5$ or $z \leq 0.3$ or $z \leq 0.2$.

Embodiment 22. The solid ion conductive material of any one of embodiments 2 to 21, wherein $d \geq 0.01$ or $d \geq 0.05$ or $d \geq 0.1$.

Embodiment 23. The solid ion conductive material of any one of embodiments 2 to 22, wherein $d \leq 0.8$ or $d \leq 0.5$.

Embodiment 24. The solid ion conductive material of any one of embodiments 1 to 9, wherein the complex metal halide is represented by $(Li_{(1-d-e)}, Na_{(d)}, M'_{(e)})_2Li_{(1-z')}Me^{3+}_{(1-u-p-q-r)} Me^{4+}_{(u)} Me^{2+}_{(p)} Me^{5+}_{(q)}Me^{6+}_{(r)}(Cl_{(1-y-w)}Br_{(y)}I_{(w)})_{(6+u-p+2q+3r-z')}$, wherein
$0 \leq d \leq 1$;
$0 \leq e < 1$;
$-3 \leq z' < 3$;
M' includes at least one of K, Rb, Cs;
$M^{3+}$ includes a rare-earth element, In, Bi, Sc, Y, Al, Ga or any combination thereof;
$Me^{4+}$ is $Zr^{4+}$, $Hf^{4+}$, $Ti^{4+}$, $Sn^{4+}$, $Th^{4+}$, $Ge^{4+}$ or any combination thereof;
$Me^{2+}$ is $Mg^{2+}$, $Zn^{2+}$, $Ca^{2+}$, $Sr^{2+}$, $Ba^{2+}$, $Yb^{2+}$, $Eu^{2+}$ or any combination thereof;
$Me^{5+}$ is $Ta^{5+}$, $Nb^{5+}$, $W^{5+}$, $Sb^{5+}$, or any combination thereof;
$Me^{6+}$ is $W^{6+}$, $Mo^{6+}$, or any combination thereof;
$0 <= w <= 1$;
$0 <= y <= 1$;
$-0.95 < z < 0.95$;
$0 <= u < 0.95$;
$0 <= p < 0.95$;
$0 <= q < 0.95$; and
$0 <= r < 0.95$.

Embodiment 25. The solid ion conductive material of embodiment 24, wherein $M^{3+}$ includes $Y^{3+}$, $Gd^{3+}$, $In^{3+}$, $Er^{3+}$, $La^{3+}$, $Sc^{3+}$, or any combination thereof, wherein $M^{3+}$ consists of $Y^{3+}$, $Gd^{3+}$, $In^{3+}$, $Er^{3+}$, $La^{3+}$, $Sc^{3+}$ or any combination thereof.

Embodiment 26. The solid ion conductive material of embodiment 24 or 25, wherein $M^{4+}$ includes $Zr^{4+}$, $Hf^{4+}$, $Ce^{4+}$, or a combination thereof, wherein $M^{4+}$ consists $Zr^{4+}$, $Hf^{4+}$, $Ce^{4+}$, or a combination thereof.

Embodiment 27. The solid ion conductive material of any one of embodiments 24 to 26, wherein:
p=0;
q=0;
r=0;
u=0; or
any combination thereof.

Embodiment 28. The solid ion conductive material of any one of embodiments 1 to 9 and 24 to 27, wherein k=2 or 3 or 4 or 5.

Embodiment 29. The solid ion conductive material of any one of embodiments 1 to 28, comprising at least 10 ppm by mass of ammonium halide for the total weight of the complex metal halide, at least 100 ppm, at least 500 ppm, at least 0.1 wt %, at least 0.3 wt %, at least 0.5 wt %, at least 0.8 wt %, or at least 1 wt % of ammonium for the weight of the complex metal halide.

Embodiment 30. The solid ion conductive material of any one of embodiments 1 to 29, comprising at most 20 wt % of ammonium for the total weight of the complex metal halide, at most 15 wt %, at most 10 wt %, at most 8 wt %, at most 5 wt %, or at most 3 wt % of ammonium for the weight of the complex metal halide.

Embodiment 31. The solid ion conductive material of any one of embodiments 1 to 30, further comprising a total content of simple metal halide of at most 0.5 wt % for the weight of the complex metal halide, at most 0.3 wt %, at most 0.1 wt %, at most 500 ppm, at most 300 ppm, at most 100 ppm, at most 50 ppm, at most 40 ppm, at most 30 ppm, at most 20 ppm, or at most 10 ppm for the weight of the complex metal halide.

Embodiment 32. The solid ion conductive material of embodiment 31, comprising at least 0.2 ppm of the simple metal halide for the total weight of the complex metal halide, at least 0.5 ppm, or at least 1 ppm for the total weight of the complex metal halide.

Embodiment 33. The solid ion conductive material of embodiment 31 or 32, wherein the simple metal halide comprises alkali metal halide, rare earth halide, or any combination thereof.

Embodiment 34. The ion conductive material of any one of embodiments 1 to 33, comprising at least 0.1 ppm by mass of electric charge neutral $Me_xN_k$ for a weight of the complex metal compound and at most 10 ppm by mass of the electric charge neutral $Me_xN_k$ for the weight of the complex metal compound.

Embodiment 35. The ion conductive material of any one of embodiments 1 to 34, comprising at least 0.1 ppm by mass of electric charge neutral $M_xN$ for a weight of the complex metal compound and at most 10 ppm by mass of the electric charge neutral $M_xN$ for the weight of the complex metal compound.

Embodiment 36. The solid ion conductive material of any one of embodiments 1 to 35, comprising an ionic conductivity in bulk of at least 0.001 mS/cm, at least 0.01 mS/cm, at least 0.1 mS/cm, at least 0.4 mS/cm, at least 0.8 mS/cm, at least 1.2 mS/cm, at least 1.8 mS/cm, or at least 2.2 mS/cm.

Embodiment 37. The solid ion conductive material of embodiment 36, comprising an ionic conductivity in bulk of at most 15 mS/cm, at most 13 mS/cm, at most 11 mS/cm, 8 mS/cm, at most 7.2 mS/cm, or at most 6.2 mS/cm.

Embodiment 38. The solid ion conductive material of any one of embodiments 1 to 37, wherein the complex metal halide is in a form of powder including an average particle size of at least 0.1 microns to 1 mm.

Embodiment 39. The solid ion conductive material of any one of embodiments 1 to 38, wherein the solid conductive material is a single crystal or polycrystalline.

Embodiment 40. The solid ion conductive material of embodiment 39, wherein the solid ion conductive material is monocrystalline or an oriented polycrystalline having a crystallographic orientation represented by <HKL> or <HKLM>, wherein an ionic conductivity in the crystallographic orientation of <HKL> or <HKLM> is higher than an ionic conductivity in a different crystallographic orientation.

Embodiment 41. The solid ion conductive material of embodiment 39 or 40, wherein the solid ion conductive material has the crystallographic orientation selected from the group consisting of <100> and <001>.

Embodiment 42. The solid ion conductive material of any one of embodiments 1 to 41, further comprising Li$_4$(NH$_2$)$_3$Cl, Li$_7$(NH$_2$)$_6$Cl, Li$_2$Br(NH$_2$), Li$_{13}$[NH]$_6$Cl, LiCl·NH$_3$, LiBr·4NH$_3$, or a combination thereof.

Embodiment 43. The solid ion conductive material of any one of embodiments 1 to 42, further comprising NH$_3$, NH$_4$X, or a combination thereof.

Embodiment 44. A solid-state electrolyte layer, comprising the solid ion conductive material of any one of embodiments 1 to 43.

Embodiment 45. A mixed electron and ion conductive layer comprising the solid ion conductive material of any one of embodiments 1 to 43, a cathode or anode active material, and optionally an electron conductive additive.

Embodiment 46. A solid-state lithium battery, comprising the solid-state electrolyte layer of embodiment 44.

Embodiment 47. A solid-state lithium battery, comprising the mixed electron and ion conductive layer of embodiment 45.

Embodiment 48. A solid electrolyte layer, comprising a single-crystal material including a complex metal halide represented by $M_{3-z}(Me^{k+})_f X_{3-z+k*f}$, wherein:
−3≤z<3;
2≤k<6;
0≤f≤1;
M comprises an alkali metal element;
Me comprises a divalent metal element, a trivalent metal element, a tetravalent metal element, a pentavalent metal element, a hexavalent metal element, or any combination thereof; and
X comprises a halogen; and
wherein the single-crystal material further comprises one of electric charge neutral Me$_x$N$_k$, and M$_x$N wherein x is a valence of N and k is the valence of Me.

Embodiment 49. A solid electrolyte layer, comprising an oriented crystalline material having a composition represented by $M_{3-z}(Me^{k+})_f X_{3-z+k*f}$, wherein:
−3≤z<3;
2≤k<6;
0≤f≤1;
M comprises an alkali metal element;
Me comprises a divalent metal element, a trivalent metal element, a tetravalent metal element, a pentavalent metal element, a hexavalent metal element, or any combination thereof; and
X comprises a halogen.

Embodiment 50. The solid electrolyte layer of embodiment 49, wherein the oriented crystalline material is an oriented ceramic or an oriented single crystal.

Embodiment 51. The solid electrolyte layer of any one of embodiments 48 to 50, wherein M comprises at least one of Li and Na.

Embodiment 52. The solid electrolyte layer of any one of embodiments 48 to 51, wherein M consists of Li or a combination of Li and at least one of Na, Cs, Rb, and K.

Embodiment 53. The solid electrolyte layer of any one of embodiments 47 to 51, wherein the composition is represented by $(Li_{1-d}Na_d)_2Li_{1-z}Me^{k+}X_{3+k-z}$, wherein:
0≤d<1;
−0.95≤z<=0.95;
2≤k<6;
Me comprises a divalent metal element, a trivalent metal element, a tetravalent metal element, a pentavalent metal element, hexavalent metal element, or any combination thereof; and
X comprises a halogen.

Embodiment 54. The solid electrolyte layer of any one of embodiments 47 to 53 wherein Me comprises a rare earth element and optionally one or more of alkaline earth metal element, Zn, Zr, Hf, Ti, Sn, Th, Ta, Nb, Mo, W, Sb, In, and Bi.

Embodiment 55. The solid electrolyte layer of any one of embodiments 47 to 54, wherein Me comprises Y, Ce, Gd, Er, Zr, La, Yb, In, Mg, or any combination thereof.

Embodiment 56. The solid electrolyte layer of any one of embodiments 47 to 55, wherein X consists of at least one of F, Cl, Br, and I, and optionally, an anion group including —NH$_2$, —(NH)$_{0.5}$, —OH (hydroxide), —BF$_4$ groups, or any combination thereof.

Embodiment 57. The solid electrolyte layer of any one of embodiments 47 to 55, wherein Me consists of Gd, Ce, Er, Yb, Zr, Y, or any combination thereof.

Embodiment 58. The solid electrolyte layer of any one of embodiments 47 to 55, wherein Me consists of Gd and optionally at least one of Ce, Er, Y, and Zr.

Embodiment 59. The solid electrolyte layer of any one of embodiments 47 to 55, wherein Me consists of Yb and Ce.

Embodiment 60. The solid electrolyte layer of any one of embodiments 47 to 55, wherein Me consists of Y and optionally at least one of Zr, Ce, Er, and Gd.

Embodiment 61. The solid electrolyte layer of any one of embodiments 47 to 60, wherein the halogen consists of one of Cl, Br, I, and F.

Embodiment 62. The solid electrolyte layer of any one of embodiments 47 to 61, wherein the halogen consists of at least two or more of Cl, Br, I, and F.

Embodiment 63. The solid electrolyte layer of any one of embodiments 47 to 62, wherein the halogen consists of Cl, Br, and I.

Embodiment 64. The solid electrolyte layer of any one of embodiments 47 to 63, wherein the composition is represented by $Li_{3-z}RE^{k+}X_{3-z+k}$, wherein RE comprises a rare earth element, Zr, or any combination thereof.

Embodiment 65. The solid electrolyte layer of any one of embodiments 47 to 64, wherein k=3 or 4 or 5.

Embodiment 66. The solid electrolyte layer of any one of embodiments 47 to 65, wherein the composition is represented $(Li_{(1-d)}, Na_{(d)})_2 Li_{(1-z)} Me^{3+}_{(1-u-p-q-r)} Me^{4+}_{(u)} Me^{2+}_{(p)} Me^{5+}_{(q)} Me^{6+}_{(r)}(Cl_{(1-y-w)}Br_{(y)}I_{(w)})_{(6+u-p+2q+3r-z)}$, wherein
0<d<=1; −0.95≤z<=0.95;
0<=u<0.95;
0<=p<0.95;
0<=q<0.95;
0<=r<0.95;
M$^{3+}$ includes a rare-earth element;
Me$^{4+}$ is Zr$^{4+}$, Hf$^{4+}$, Ti$^{4+}$, Sn$^{4+}$, Th$^{4+}$, or any combination thereof;
Me$^{2+}$ is Mg$^{2+}$, Zn$^{2+}$, Ca$^{2+}$, Sr$^{2+}$, Ba$^{2+}$, Yb$^{2+}$, Eu$^{2+}$ or any combination thereof;
Me$^{5+}$ is Ta$^{5+}$, Nb$^{5+}$, W$^{5+}$, Sb$^{5+}$, or any combination thereof;
Me$^{6+}$ is W$^{6+}$;
0<=y<=1; and
w<=1.

Embodiment 67. The solid electrolyte layer of embodiment 66, wherein M$^{3+}$ includes Y$^{3+}$, Gd$^{3+}$, In$^{3+}$, Er$^{3+}$, La$^{3+}$, or any combination thereof, wherein M$^{3+}$ consists of Y$^{3+}$, Gd$^{3+}$, In$^{3+}$, Er$^{3+}$, La$^{3+}$, or any combination thereof.

Embodiment 68. The solid electrolyte layer of embodiment 66 or 67, wherein M$^{4+}$ includes Zr$^{4+}$, Ce$^{4+}$, or a combination thereof, wherein M$^{4+}$ consists Zr$^{4+}$, Ce$^{4+}$, or a combination thereof.

Embodiment 69. The solid electrolyte layer of any one of embodiments 63 to 68, wherein:
p=0;
q=0;
u=0; or
any combination thereof.

Embodiment 70. The solid electrolyte layer of any one of embodiments 47 to 69, wherein z≤0.5 or z≤0.3 or z≤0.2.

Embodiment 71. The solid electrolyte layer of any one of embodiments 47 to 70, wherein d≥0.01 or d≥0.05 or d≥0.1.

Embodiment 72. The solid electrolyte layer of any one of embodiments 47 to 71, wherein d≤0.8 or d≤0.5.

Embodiment 73. The solid electrolyte layer of any one of embodiments 47 to 72, wherein the crystalline material comprising a total content of an impurity of at most 0.5 wt %, at most 0.2 wt %, at most 0.1 wt %, at most 500 ppm, at most 200 ppm, at most 100 ppm, or at most 50 ppm for the total weight of the crystalline material.

Embodiment 74. The solid electrolyte layer of embodiment 73, wherein the impurity comprises a simple metal halide including a rare earth halide, an alkali halide, electric charge neutral $Me_xN_k$, electric charge neutral $M_xN$, or any combination thereof.

Embodiment 75. The solid electrolyte layer of any one of embodiments 47 to 74, wherein the crystalline material comprising a total content of an impurity of at least 2 ppm for a weight of the complex metal halide, at least 5 ppm, or at least 10 ppm for the weight of the crystalline material.

Embodiment 76. The solid electrolyte layer of any one of embodiments 47 to 75, wherein the crystalline material comprises at least 0.1 ppm by mass and at most 10 ppm by mass of electric charge neutral $Me_xN_k$ for a weight of the complex metal halide.

Embodiment 77. The solid electrolyte layer of any one of embodiments 47 to 76, wherein the crystalline material comprises at least 0.1 ppm by mass and at most 10 ppm by mass of electric charge neutral $M_xN$ for a weight of the complex metal halide.

Embodiment 78. The solid electrolyte layer of any one of embodiments 47 to 77, wherein the crystalline material comprises $Li_4(NH_2)_3Cl$, $Li_7(NH_2)_6Cl$, $Li_2Br(NH_2)$, $Li_{13}[NH]_6Cl$, $LiCl \cdot NH_3$, $LiBr \cdot 4NH_3$, or a combination thereof.

Embodiment 79. The solid electrolyte layer of any one of embodiments 47 to 78, wherein the crystalline material comprises $NH_3$, $NH_4X$, or a combination thereof.

Embodiment 80. The solid electrolyte layer of any one of embodiments 47 to 79, wherein the crystalline material comprises a bulk ionic conductivity of at least 0.01 mS/cm, at least 0.1 mS/cm, at least 0.2 mS/cm, at least 0.4 mS/cm, at least 0.5 mS/cm at least 0.8 mS/cm, at least 1.2 mS/cm, at least 1.8 mS/cm, or at least 2.2 mS/cm at 22° C. and activation energy in the range 0.01 eV and 0.5 eV, or wherein the crystalline material comprises an ionic conductivity of at most 15 mS/cm, at most 11 mS/cm, at most 9 mS/cm, at most 8 mS/cm, at most 7.2 mS/cm, or at most 6.2 mS/cm.

Embodiment 81. The solid electrolyte layer of any one of embodiments 1 to 80, comprising a thickness, wherein the thickness extends in a crystallography orientation of <HKL> or <HKLM>, wherein an ionic conductivity in the crystallographic orientation of <HKL> or <HKLM> is higher than an ionic conductivity in a different crystallographic orientation.

Embodiment 82. The solid electrolyte layer of embodiment 81, wherein the crystallography direction is selected from the group consisting of <100>, <001>, and <010>.

Embodiment 83. The solid electrolyte layer of any one of embodiments 47 to 82, wherein the single crystal material is in a form of a sheet.

Embodiment 84. The solid electrolyte layer of any one of embodiments 1 to 83, comprising a thickness from 5 microns to 500 microns.

Embodiment 85. A process of forming a solid ion conductive material, comprising: forming $(NH_4)_nMe^{k+}X_{3+k}$, wherein forming $(NH_4)_nMe^{k+}X_{3+k}$ comprises chemically substituting moisture in a hydrated salt-containing $REX_3$ with $NH_4X$, wherein n>0; Me comprises a rare earth element, Zr, or a combination thereof; and X is one or more halogen.

Embodiment 86. The process of embodiment 85, further comprising performing a solid-state reaction of $(NH_4)_nMe^{k+}X_{3+k}$ and MX, wherein M comprises an alkali metal.

Embodiment 87. The process of embodiment 85 or 86, further comprising decomposing $(NH_4)_nMe^{k+}X3+k$.

Embodiment 88. The process of any one of embodiments 85 to 87, further comprising forming the solid ion conductive material including a complex metal halide represented by $M_{3-z}Me^{k+}X_{3-z+k}$, wherein −3≤z<3; 2≤k<6; M comprises at least one of Li and Na, wherein the solid ion conductive material comprises a total content of an impurity of at most 0.5 wt % for the weight of the solid ion conductive material.

Embodiment 89. The process of embodiment 88, wherein the impurity comprises $Me^{k+}X_k$, MX, or a combination thereof.

Embodiment 90. The process of any one of embodiments 86 to 89, further comprising growing a crystal including the complex metal halide.

Embodiment 91. The process of any one of embodiments 85 to 90, further comprising forming an oriented crystalline material including a crystallographic orientation selected from the group consisting of <010>, <100>, and <001>.

Embodiment 92. The process of embodiment 90 or 91, further comprising growing the crystal from a melt, wherein the melt comprises the complex metal halide and optionally a dopant material.

Embodiment 93. The process of any one of embodiments 85 to 92, wherein the ion conductive material is a polycrystalline material.

Embodiment 94. The process of any one of embodiments 85 to 93, wherein the ion conductive material comprises a content of electric charge neutral $Me_xN_k$ of at most 0.5 wt % for a weight of the ion conductive material;

Embodiment 95. The process of any one of embodiments 85 to 94, wherein the ion conductive material comprises a content of $Me_x N_k$ of at least 0.1 ppm and at most 10 ppm by mass for a weight of the ion conductive material.

Embodiment 96. The process of any one of embodiments 85 to 95, wherein the ion conductive material comprises a content of electric charge neutral $M_xN$ of at most 0.5 wt % for a weight of the ion conductive material.

Embodiment 97. The process of any one of embodiments 85 to 96, wherein the ion conductive material comprises a content of electric charge neutral $M_xN$ of at least 0.1 ppm and at most 10 ppm by mass for a weight of the ion conductive material.

Embodiment 98. The process of any one of embodiments 85 to 97, wherein the ion conductive material further comprising forming $Li_4(NH_2)_3Cl$, $Li_7(NH_2)_6Cl$, $Li_2Br(NH_2)$, $Li_{13}[NH]_6Cl$, $LiCl \cdot NH_3$, $LiBr \cdot 4NH_3$, or a combination thereof.

Embodiment 99. The process of any one of embodiments 85 to 97, wherein the ion conductive material further comprises $NH_3$, $NH_4X$, or a combination thereof.

EXAMPLES

Example 1

Samples 1 to 30 were formed having the composition noted in Table 1. Content of impurity of simple metal halide is included in Table 1 and the phase for each impurity was detected by XRD analysis coupled with Rietveld refinements for quantitative analysis through the presence of characteristic diffraction peaks corresponding to the parasitic phases.

All Samples had a content of metal nitride of up to 10 ppm.

Samples 1, 2, 4 to 6, 15, 17, and 30 were pressed ceramics pellets and heated under dry inert conditions. The pellets were formed according to the humid ammonium route described in embodiments herein except Sample 6. Sample 6 was formed by using the one-step forming process described in embodiments herein. The pellets are 5 to 13 mm (diameter) by 0.5 to 4 mm (thickness). Samples 8 to 14 and 18 to 29 are sliced from single crystals formed according to embodiments herein. For the formation of Samples 20, 21, and 23, LiCl, LiBr, and LiI salts were also used respectively, as the additives for the starting material charges for the crystal growth of anionically substituted compounds.

Ionic conductivity of the samples was determined using an electrochemical impedance spectroscopy method with gold blocking electrodes under the condition of an AC frequency of 3 MHz-10 Hz and 10 to 50 mV of peak-to-peak sinusoidal AC voltage signal at room temperature (approximately 22° C.).

The ion conductivity of bulk grains in Samples 1, 2, 4 to 6, 15, 17, and 30 was included in Table 1. The conductivity contribution from bulk grains could be separated from grains boundary and the electrode contact because the bulk grain conductivity features appear at the highest frequencies and are associated with the lowest value of double-layer capacitance.

For Sample 3, neither direction A and direction B corresponds to the orientations that demonstrates maximal thermal and/or ionic conductivities of $Li_3YCl_6$. Slicing in direction A resulted in a ceramic sample having grains in random crystallographic orientations. Direction A can be determined by vector a, wherein $a=\alpha^*<100>+\beta^*<010>$, and wherein $-1.0<\alpha<1.0$ and $-1.0<\beta<1.0$. Slicing in direction B resulted in an oriented ceramic sample having the orientation close to $<001>$ crystallographic orientation.

TABLE 1

| № example | Composition | Synthesis method | Measured Ionic Conductivity, mS/cm | Impurities concentration |
|---|---|---|---|---|
| 1 | $Li_3YCl_6$ | Ceramics form Humid ammonium chloride + sublimation | 0.2 | 4.2 wt % LiCl + 2.5 wt % $YCl_3$ |
| 2 | $Li_3YCl_6$ | Ceramics form Humid ammonium chloride + sublimation + grinding + reactive sublimation | 0.4 | Not detectable, below ~0.2 wt % |
| 3 | $Li_3YCl_6$ | Crystal growth of dense block composed of mm-size single crystals. Block sliced along two directions. | 0.53 (direction A) 0.96 (direction B) | Not detectable, below ~0.2 wt % |
| 4 | $Li_3YBr_6$ | Ceramics form Humid ammonium bromide + sublimation | 0.7 | 5.4 wt % LiBr + 3.1 wt % $YBr_3$ |
| 5 | $Li_3YBr_6$ | Ceramics form Humid ammonium chloride + sublimation + grinding + reactive sublimation | 1.5 | Not detectable, below ~0.2 wt % |
| 6 | $Li_3YBr_6$ | Ceramics form Reaction at dry condition with ammonium bromide followed by sublimation ammonium bromide | 0.47 | 6.7 wt % LiBr + 3.5 wt % $YBr_3$ |
| 7 | $Li_3YBr_6$, Orientations $<100>$ $<010>$ $<001>$ | Crystal growth of finger-sized single crystal ingot | 1.8 1.3 3.1 | Not detectable, below ~0.2 wt % |
| 8 | $(Na_{0.1}, Li_{0.9})_2LiYCl_6$ | Crystal growth | 0.7 | Not detectable, below ~0.2 wt % |
| 9 | $(Na_{0.1}, Li_{0.9})_2LiYBr_6$ | Crystal growth | 0.9 | Not detectable, below ~0.2 wt % |
| 10 | $Li_{2.8}YCl_{5.8}$ | Crystal growth | 0.95 | Not detectable, below ~0.2 wt % |
| 11 | $Li_{2.8}YBr_{5.8}$ | Crystal growth | 1.7 | Not detectable, below ~0.2 wt % |
| 12 | $Li_3Y_{0.95}Ce_{0.05}Cl_6$ | Crystal growth | 0.5 | Not detectable, below ~0.2 wt % |
| 13 | $Li_3Y_{0.95}Ce_{0.05}Br_6$ | Crystal growth | 1.5 | Not detectable, below ~0.2 wt % |
| 14 | $Li_3Y_{0.8}Gd_{0.2}Br_6$ | Crystal growth | 1.6 | Not detectable, below ~0.2 wt % |
| 15 | $Li_3GdBr_6$ | Ceramics form powder formed by Humid ammonium bromide + sublimation + grinding | 1.1 | 4.7 wt % LiBr |

TABLE 1-continued

| № example | Composition | Synthesis method | Measured Ionic Conductivity, mS/cm | Impurities concentration |
|---|---|---|---|---|
| 16 | $Li_3GdBr_6$ | Crystal growth | 3.5 | Not detectable, below ~0.2 wt % |
| 17 | $Li_3GdCl_6$ | Ceramics form Humid ammonium chloride + sublimation + grinding | 0.9 | 3.8% LiCl + 1.5% $GdCl_3$ |
| 18 | $Li_3GdCl_6$ | Crystal growth | 1.8 | Not detectable, below ~0.2 wt % |
| 19 | $Li_3Y_{0.7}Er_{0.3}Br_6$ | Crystal growth | 1.3 | Not detectable, below ~0.2 wt % |
| 20 | $(Li_{0.9}, Na_{0.1})_2LiY_{0.8}Zr_{0.2}Cl_{6.2}$ | Crystal growth | 3.1 | Not detectable, below ~0.2 wt % |
| 21 | $(Li_{0.7}, Na_{0.3})_2LiY_{0.7}Zr_{0.3}Br_{6.3}$ | Crystal growth | 2.8 | Not detectable, below ~0.2 wt % |
| 22 | $Li_3YBr_{4.5}Cl_{1.5}$ | Crystal growth | 1.1 | Not detectable, below ~0.2 wt % |
| 23 | $Li_3YBr_{5.2}I_{0.8}$ | Crystal growth | 2.2 | Not detectable, below ~0.2 wt % |
| 24 | $Cs_2LiLa_{0.98}Ce_{0.02}Br_6$ | Crystal growth | 0.1 | Not detectable, below ~0.2 wt % |
| 25 | $Cs_2LiY_{0.98}Ce_{0.02}Cl_6$ | Crystal growth | 0.04 | Not detectable, below ~0.2 wt % |
| 26 | $Li_3YbBr_6$ | Crystal growth | 0.8 | Not detectable, below ~0.2 wt % |
| 27 | $Li_3YbCl_6$ | Crystal growth | 0.7 | Not detectable, below ~0.2 wt % |
| 28 | $Li_3Yb_{0.98}Ce_{0.02}Br_6$ | Crystal growth | 0.85 | Not detectable, below ~0.2 wt % |
| 29 | $Li_3Yb_{0.97}Ce_{0.03}Cl_6$ | Crystal growth | 0.75 | Not detectable, below ~0.2 wt % |
| 30 | $Li_3Y_{0.23}In_{0.11}Zr_{0.33}Mg_{0.33}Cl_6$ | Ceramics form Humid ammonium chloride + sublimation + grinding | 0.5 | 5.4 wt % LiBr + 2.6 wt % $MgCl_3$ |

Example 2

A poly-crystalline block of $Li_3YB_6$ was formed having a cylindrical shape and a dimension of 7 cm×10 cm. The block is composed of densely packed single crystals having mm to cm sizes and arranged in a mica-like layered orientation. The bulk ion conductivity was measured on small pieces broken-off from the center of the block. The pieces were polished into approximately 0.7 mm thick parallelized samples and the impedance was measured in the same manner as described in Example 1. It was approximately 0.5 or 2.5 mS/cm depending on the direction of the sample chosen. XRD analysis confirmed that the two samples had different crystallographic orientations.

The first sample with grains mainly (more than 80%) oriented approximately along the crystallographic direction <100> having also the maximum thermal conductivity and showed higher ionic conductivity. The second sample is demonstrating randomly oriented grains with crystallographic orientations belonging to the plane orthogonal to the <001> direction;

Example 3

The crystalline pure material was milled using an automated mortar and pestle grinder. This low energy milling preserves the purity of the materials. The same material was milled in high energy ball milling, and a partial decomposition of the pure material was observed, as indicated by the appearance of small signatures of simple halides in the XRD analysis. The conductivity of the decomposed powder was lower than the pure powder or the oriented crystal/ceramic.

Example 4

| № Sample | Composition | Synthesis method | Measured Ionic Conductivity, mS/cm | Impurities concentration, non-reacted or decomposed |
|---|---|---|---|---|
| C1.B | $Li_3YCl_6$ | Ball milling at room temperature for 24 hrs, with starting materials of dry LiCl and anhydrous $YCl_3$ at stoichiometric proportion | 0.15 | 11.5 wt % LiCl + 8.0 wt % $YCl_3$ |

-continued

| № Sample | Composition | Synthesis method | Measured Ionic Conductivity, mS/cm | Impurities concentration, non-reacted or decomposed |
|---|---|---|---|---|
| C4.B | $Li_3YBr_6$ | Ball milling at room temperature for 24 hrs, using starting materials of dry LiBr and anhydrous $YBr_3$ at stoichiometric proportion | 0.6 | 10.5 wt % LiBr + 7.5 wt % $YBr_3$ |
| C1.C | $Li_3YCl_6$ | Solid-state reaction with $NH_4Cl$ and Sublimation at 450° C. using starting materials of $Li_2CO_3$ and $Y_2O_3$ mixed at stoichiometric proportion of 3*Li/Y being 1 and $NH_4Cl$ in excess | 0.05 | 14.5 wt % LiCl + 7 wt % YOCl + 3.5 wt % $YCl_3$ |
| C4.C | $Li_3YBr_6$ | Solid-state reaction with $NH_4Br$ and Sublimation at 450° C., using starting materials $Li_2CO_3$ and $Y_2O_3$ at 3*Li/Y being 1 stoichiometric proportion and $NH_4Br$ in excess | 0.45 | 13 wt % LiBr + 6 wt % YOBr + 3 wt % YBr |

It is noted the high energy ball milling synthesis can generate in parallel the reactions of synthesis but also the decomposition of the principal complex metal halide phase. Comparing to process of embodiments herein, the high energy ball milling synthesis can generate significantly higher contents of simple compounds, such as LiX and $YX_3$, that are present as the impurities in the vicinity of principal $Li_3YX_6$ phase.

It is also noted a single phase of $Li_3YX_6$ may not be synthesized when starting from oxides ($Y_2O_3$) or carbonate materials ($Li_2CO_3$) with the addition of ammonium halide in the solid-state reaction at 1 bar atmospheric pressure. At least two chemical reactions can take place for the rare-earth metal (i.e., Y in the example of $Li_3YX_6$) conversion into halide compounds. One principal reaction can result in $YX_3$ synthesis that can further react to form the $Li_3YX_6$ phase. The second reaction can result in the formation of YOX. YOX is a stable compound and can be present as an impurity in the final product of $Li_3YX_6$.

Example 5

Additional samples were formed. Sample 35 was synthesized by using a stoichiometric mixture of LiBr and $YBr_3$ compounds in welded quartz ampoule under vacuum with heat up to 650° C. After the reaction mixture melted, a soak time of up to an hour at 650° C. was applied to ensure reaction products are dissolved in the self flux. Then the temperature of the quartz ampoule was dropped down promptly (in 2-3 minutes) to 400° C. to help minimize partial decompositions of the incongruent $Li_3YBr_6$ phase. Then the temperature of the quartz ampoule was decreased progressively to room temperature at a rate of 50-100° C./hour.

Samples 36 and 37 were synthesized according to embodiments herein voluntarily keeping ammonium. The quantity of residual ammonium was estimated by posterior overheating of a compound up to the melting temperature permitting to fully sublimate ammonium halide from the charge. Ionic conductivity in the bulk of the samples was measured in a similar manner as described in Example 1.

| Sample | Compound | Ionic conductivity, mS/cm |
|---|---|---|
| 35 | $Li_3YBr_6$ | 1.6 |
| 36 | $Li_3YBr_6$ + 0.001 $NH_4Br$ | 1.9 |
| 37 | $Li_3YBr_6$ + 0.2 $NH_4Br$ | 2.5 |

Benefits, other advantages, and solutions to problems have been described above with regard to specific embodiments. However, the benefits, advantages, solutions to problems and any feature(s) that may cause any benefit, advantage, or solution to occur or become more pronounced are not to be construed as a critical, required, or essential feature of any or all the claims. Reference herein to a material including one or more components may be interpreted to include at least one embodiment wherein the material consists essentially of the one or more components identified. The term "consisting essentially" will be interpreted to include a composition including those materials identified and excluding all other materials except in minority contents (e.g., impurity contents), which do not significantly alter the properties of the material. Additionally, or in the alternative, in certain non-limiting embodiments, any of the compositions identified herein may be essentially free of materials that are not expressly disclosed. The embodiments herein include a range of contents for certain components within a material, and it will be appreciated that the contents of the components within a given material total 100%.

The specification and illustrations of the embodiments described herein are intended to provide a general understanding of the structure of the various embodiments. The specification and illustrations are not intended to serve as an exhaustive and comprehensive description of all of the elements and features of apparatus and systems that use the structures or methods described herein. Separate embodiments may also be provided in combination in a single embodiment, and conversely, various features that are, for brevity, described in the context of a single embodiment, may also be provided separately or in any subcombination. Further, reference to values stated in ranges includes each and every value within that range. Many other embodiments may be apparent to skilled artisans only after reading this specification. Other embodiments may be used and derived from the disclosure, such that a structural substitution, logical substitution, or another change may be made without departing from the scope of the disclosure. Accordingly, the disclosure is to be regarded as illustrative rather than restrictive.

What is claimed is:

1. A solid ion conductive material, comprising a crystallographically-oriented ceramic material, wherein grains of the crystallographically-oriented ceramic material are oriented in a particular direction; and wherein the crystallographically-oriented ceramic material comprises a halide material represented by $M_{3-z}(Me^{k+})_f X_{3-z+k*f}$, wherein:
   $-3 \leq z < 3$;
   $2 \leq k < 6$;
   $0 \leq f \leq 1$;
   M comprises an alkali metal element;
   Me comprises a divalent metal element, a trivalent metal element, a tetravalent metal element, a pentavalent metal element, a hexavalent metal element, or any combination thereof;
   X comprises a halogen; and
   the halide material comprises at least two different cations,
wherein the halide material further comprises:
   a total content of simple metal halide of at most 2 wt % for a weight of the halide material, wherein the simple metal halide comprises alkali metal halide, rare earth halide, or any combination thereof;
   at least one of electric charge neutral $Me_x N_k$ or $M_x N$, wherein x is a valence of N and k is the valence of Me; or
   any combination thereof.

2. The solid ion conductive material of claim 1, wherein the halogen is one or more elements selected from the group consisting of Cl, Br, and F.

3. The solid ion conductive material of claim 1, wherein the halogen consists of at least two or more of Cl, Br, I, and F.

4. The solid ion conductive material of claim 1, wherein M comprises at least one of Li and Na.

5. The solid ion conductive material of claim 1, wherein the halide material is represented by $Li_{3-z}Me^{k+}X_{3-z+k}$, wherein Me comprises a rare earth element, Al, Zr, Hf, In, Mg, Zn, or any combination thereof.

6. The solid ion conductive material of claim 1, wherein the halide material comprises a total content of simple metal halide of at most 2 wt % for a weight of the halide material, wherein the simple metal halide comprises alkali metal halide, rare earth halide, or any combination thereof.

7. The solid ion conductive material of claim 1, wherein the crystallographically-oriented ceramic material has a crystallographic orientation represented by <HKL> or <HKLM>, wherein an ionic conductivity in the crystallographic orientation of <HKL> or <HKLM> is higher than an ionic conductivity in a different crystallographic orientation, wherein more than 80% of the grains are oriented in the crystallographic orientation represented by <HKL> or <HKLM>.

8. The solid ion conductive material of claim 1, wherein the halide material is represented by $(Li_{(1-d-e)}, Na_{(d)}, M'_{(e)})_2 Li_{(1-z')} Me^{3+}_{(1-u-p-q-r)} Me^{4+}_{(u)} Me^{2+}_{(p)} Me^{5+}_{(q)} Me^{6+}_{(r)}(Cl_{(1-y-w)}Br_{(y)}I_{(w)})_{(6+u-p+2q+3r-z')}$, wherein:
   $0 \leq d \leq 1$;
   $0 \leq e < 1$;
   $-3 \leq z' < 3$;
   M' includes at least one of K, Rb, or Cs;
   $M^{3+}$ includes a rare-earth element, In, Bi, Sc, Y, Al, Ga or any combination thereof;
   $Me^{4+}$ is $Zr^{4+}$, $Hf^{4+}$, $Ti^{4+}$, $Sn^{4+}$, $Th^{4+}$, $Ge^{4+}$ or any combination thereof;
   $Me^{2+}$ is $Mg^{2+}$, $Zn^{2+}$, $Ca^{2+}$, $Sr^{2+}$, $Ba^{2+}$, $Yb^{2+}$, $Eu^{2+}$ or any combination thereof;
   $Me^{5+}$ is $Ta^{5+}$, $Nb^{5+}$, $W^{5+}$, $Sb^{5+}$, or any combination thereof;
   $Me^{6+}$ is $W^{6+}$, $Mo^{6+}$, or any combination thereof;
   $0 \leq w \leq 1$;
   $0 \leq y \leq 1$;
   $0 \leq (y+w) \leq 1$;
   $-0.95 < z < 0.95$;
   $0 \leq u < 0.95$;
   $0 \leq p < 0.95$;
   $0 \leq q < 0.95$;
   $0 \leq r < 0.95$; and
   $0 \leq (u+p+q+r) \leq 1$, wherein $(d+e) > 0$ when $(u+p+q+r) \leq 1$.

9. The solid ion conductive material of claim 8, wherein $(u+p+q+r) < 1$, and wherein $M^{3+}$ includes $Y^{3+}$, $Gd^{3+}$, $In^{3+}$, $Er^{3+}$, $La^{3+}$, $Sc^{3+}$, or any combination thereof.

10. The solid ion conductive material of claim 8, wherein $u > 0$, and wherein $M^{4+}$ includes $Zr^{4+}$, $Hf^{4+}$, $Ce^{4+}$, or a combination thereof.

11. A solid ion conductive material, comprising a crystallographically-oriented ceramic material, wherein grains of the crystallographically-oriented ceramic material are oriented in a particular direction; and wherein the crystallographically-oriented ceramic material comprises a halide material represented by $(Li_{1-d-e}, Na_d, M'_e)_2 Li_{1-z}(Me^{k+})_f X_{3+k*f-z}$, wherein:
   $-1 \leq z < 1$;
   $2 \leq k < 6$;
   $0 \leq f \leq 1$;
   $0 \leq d \leq 1$;
   $0 \leq e < 1$;
   $(d+e+f) > 0$;
   Me comprises a divalent metal element, a trivalent metal element, a tetravalent metal element, a pentavalent metal element, a hexavalent metal element, or any combination thereof; and X comprises a halogen; and
   M' consists of at least one of K, Rb, and Cs,
   wherein the halide material further comprises:
      at least one of electric charge neutral $Me_x N_k$ or $M_x N$, wherein x is a valence of N and k is the valence of Me;
      a total content of simple metal halide of at most 2 wt % for a weight of the halide material, wherein the simple metal halide comprises alkali metal halide, rare earth halide, or any combination thereof; or
      a combination thereof.

12. The solid ion conductive material of claim 11, wherein $(d+e) > 0$, and wherein Li makes up at least 50 mol % for a total of Li, Na, and M'.

13. The solid ion conductive material of claim 11, comprising a total content of simple metal halide of at most 2 wt % for a weight of the halide material, wherein the simple metal halide comprises alkali metal halide, rare earth halide, or any combination thereof.

14. The solid ion conductive material of claim 11, wherein the halide material is represented by $Li_{3-z}(Me^{k+})_f X_{3-z+k*f}$, wherein $0<f\leq1$; and X comprises a halogen including at least one of Cl or Br.

15. The solid ion conductive material of claim 11, further comprising at least one of the electric charge neutral $Me_x N_k$ or $M_x N$, wherein x is a valence of N and k is the valence of Me.

16. A solid electrolyte layer, comprising a crystallographically-oriented crystalline material comprising a halide material represented by $(Li_{1-d-e}, Na_d, M'_e)_2 Li_{1-z}(Me^{k+})_f X_{3+k*f-z}$, wherein:
- $-3 \leq z < 3$;
- $2 \leq k < 6$;
- $0 \leq f \leq 1$;
- $-3 \leq z < 3$;
- $2 \leq k < 6$;
- $0 \leq f \leq 1$;
- $0 \leq d \leq 1$;
- $0 \leq e < 1$;
- $(d+e) > 0$; and
- M' consists of at least one of K, Rb, and C;
- Me comprises a divalent metal element, a trivalent metal element, a tetravalent metal element, a pentavalent metal element, a hexavalent metal element, or any combination thereof;
- X comprises a halogen; and
- the halide material comprises at least two different cations,
- wherein a crystallographic orientation of the crystallographically oriented crystalline material is in a direction of a thickness of the solid electrolyte layer, wherein an ionic conductivity in the crystallographic orientation is higher than an ionic conductivity in a different crystallographic orientation,
- wherein the solid electrolyte layer further comprises:
- a total content of simple metal halide of at most 2 wt % for a weight of the halide material, wherein the simple metal halide comprises alkali metal halide, rare earth halide, or any combination thereof;
- at least one of electric charge neutral $Me_x N_k$ or $M_x N$, wherein x is a valence of N and k is the valence of Me; or
- any combination thereof.

17. The solid electrolyte layer of claim 16, wherein the crystallographically-oriented crystalline material is a ceramic material comprising grains having a crystallographic orientation in the direction of the thickness of the solid electrolyte layer.

18. The solid electrolyte layer of claim 16, wherein the halide material is represented by $Li_{3-z}(Me^{k+})_f X_{3-z+k*f}$, wherein $0<f\leq1$; and X comprises a halogen including at least one of Cl or Br.

19. The solid electrolyte layer of claim 16, wherein the crystallographically-oriented crystalline material is a single-crystal material.

* * * * *